United States Patent
Lee et al.

(10) Patent No.: US 12,490,556 B2
(45) Date of Patent: Dec. 2, 2025

(54) DISPLAY DEVICE

(71) Applicant: Samsung Display Co., LTD., Yongin-si (KR)

(72) Inventors: Dong Hyun Lee, Asan-si (KR); Si Joon Song, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 830 days.

(21) Appl. No.: 17/585,412

(22) Filed: Jan. 26, 2022

(65) Prior Publication Data

US 2023/0014374 A1 Jan. 19, 2023

(30) Foreign Application Priority Data

Jul. 15, 2021 (KR) .................. 10-2021-0092771

(51) Int. Cl.
*H10H 20/854* (2025.01)
*H10H 20/85* (2025.01)
*H10H 20/857* (2025.01)

(52) U.S. Cl.
CPC ...... *H10H 20/8506* (2025.01); *H10H 20/854* (2025.01); *H10H 20/857* (2025.01)

(58) Field of Classification Search
CPC .................. H10K 50/8426; H01L 33/62
See application file for complete search history.

(56) References Cited

U.S. PATENT DOCUMENTS

| | | |
|---|---|---|
| 9,379,355 B1 | 6/2016 | Lee |
| 9,847,506 B2 | 12/2017 | Lee |
| 10,505,147 B2 | 12/2019 | Lee |
| 10,642,109 B2 | 5/2020 | Ko et al. |
| 10,649,256 B2 | 5/2020 | Cho et al. |
| 10,943,961 B2 | 3/2021 | Kim et al. |
| 2011/0007042 A1* | 1/2011 | Miyaguchi ........ G02F 1/133305 345/204 |
| 2013/0148312 A1* | 6/2013 | Han ............... H05K 1/028 361/736 |
| 2014/0078692 A1* | 3/2014 | Park ............ H05K 3/361 361/749 |

(Continued)

FOREIGN PATENT DOCUMENTS

| | | |
|---|---|---|
| EP | 3 595 027 A1 | 1/2020 |
| KR | 10-2017-0095938 A | 8/2017 |

(Continued)

*Primary Examiner* — Matthew C Landau
*Assistant Examiner* — Nora T. Nix
(74) *Attorney, Agent, or Firm* — Womble Bond Dickinson (US) LLP

(57) ABSTRACT

A display device includes: a display substrate having a display area and a pad area at one side of the display area; an optical layer on the display area of a first surface of the display substrate; a circuit board on the pad area of the display substrate; and a first sealing material on the pad area of the display substrate to cover the circuit board. The circuit board has: a first portion attached to the first surface of the display substrate, a second portion bent downwardly from the first surface and attached to another surface of the display substrate, and a third portion bent between the first portion and the second portion. The first sealing material covers at least some of the first portion and the third portion.

20 Claims, 40 Drawing Sheets

(56) References Cited

U.S. PATENT DOCUMENTS

| | | | |
|---|---|---|---|
| 2016/0099435 A1* | 4/2016 | Yang | H01L 23/4985 |
| | | | 257/88 |
| 2016/0172623 A1 | 6/2016 | Lee | |
| 2016/0174304 A1* | 6/2016 | Kim | H10K 59/8792 |
| 2016/0204366 A1 | 7/2016 | Zhang et al. | |
| 2017/0047547 A1* | 2/2017 | Son | H10K 59/131 |
| 2018/0006004 A1 | 1/2018 | Namkung et al. | |
| 2018/0081399 A1* | 3/2018 | Kwon | G09G 5/00 |
| 2018/0138412 A1* | 5/2018 | Han | H01L 22/14 |
| 2019/0109288 A1 | 4/2019 | Li et al. | |
| 2019/0340959 A1 | 11/2019 | Park | |
| 2020/0028114 A1* | 1/2020 | Zhai | G06F 3/044 |

FOREIGN PATENT DOCUMENTS

| | | |
|---|---|---|
| KR | 10-2018-0046199 A | 5/2018 |
| KR | 10-2018-0076693 A | 7/2018 |
| KR | 10-2020-0008070 A | 1/2020 |
| KR | 10-2200337 B1 | 1/2021 |

* cited by examiner

FIG. 8
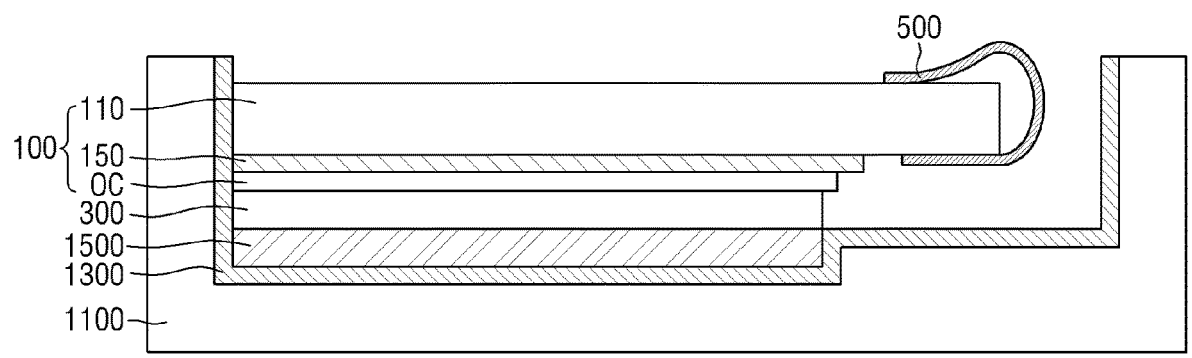
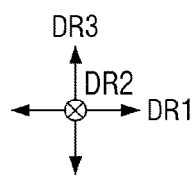

FIG. 37
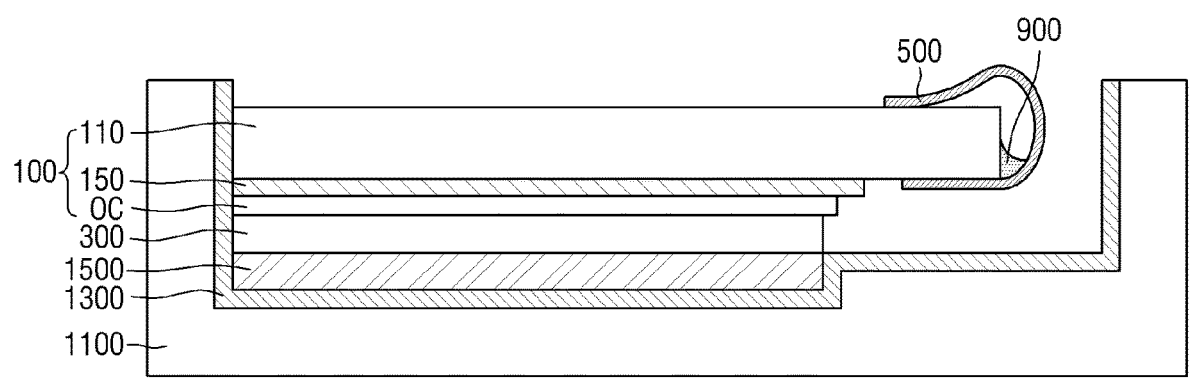
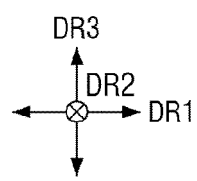

DISPLAY DEVICE

CROSS-REFERENCE TO RELATED APPLICATION

This application claims priority to and the benefit of Korean Patent Application No. 10-2021-0092771, filed on Jul. 15, 2021, in the Korean Intellectual Property Office, the content of which is herein incorporated by reference in its entirety.

BACKGROUND

1. Field

Aspects of embodiments of the present disclosure relate to a display device.

2. Description of the Related Art

Display devices are becoming more important with developments in multimedia technology. Accordingly, various display devices, such as an organic light-emitting diode (OLED) display device, a liquid crystal display (LCD) device, and the like, have been developed.

Self-luminous display devices include light-emitting elements. Examples of the self-luminous display devices include an organic light-emitting display device using an organic material as a light-emitting material or an inorganic light emitting display device using an inorganic material as a light-emitting material.

SUMMARY

Embodiments of the present disclosure provide a display device including a sealing material covering top surfaces and side surfaces of circuit boards to protect the circuit boards.

However, aspects of the present disclosure are not limited to that set forth above. The above and other aspects and features of the present disclosure will become more apparent to one of ordinary skill in the art to which the present disclosure pertains by referencing the detailed description of the present disclosure given below.

The display device, according to one embodiment, may include circuit boards disposed (e.g., arranged) on one side and the other side of a display substrate and a sealing material covering an upper side and lateral sides of the circuit board. The display device may safely protect the circuit boards because the sealing material is disposed to cover most of the outer surfaces of the circuit boards. Further, the display device may prevent or substantially prevent an appearance defect because the stepped portion formed by the circuit boards is compensated by the sealing material.

However, the aspects and features of the present disclosure are not limited to the aforementioned aspects and features, and various other aspects and features are described herein.

According to an embodiment of the present disclosure, a display device includes: a display substrate having a display area and a pad area at one side of the display area; an optical layer on the display area of a first surface of the display substrate; a circuit board on the pad area of the display substrate; and a first sealing material on the pad area of the display substrate to cover the circuit board. The circuit board has: a first portion attached to the first surface of the display substrate, a second portion bent downwardly from the first surface and attached to another surface of the display substrate, and a third portion bent between the first portion and the second portion. The first sealing material covers at least some of the first portion and the third portion.

The first sealing material may not be between one lateral side of the display substrate and the third portion of the circuit board.

The display device may further include a second sealing material between the one lateral side of the display substrate and the third portion of the circuit board, and the second sealing material may contact each of the one lateral side of the display substrate and an inner side surface of the circuit board.

The first sealing material and the second sealing material may be separated from each other.

The first sealing material may have a top surface and a side surface of a portion covering the third portion, and the top surface and the side surface of the first sealing material may be flat surfaces.

In the first sealing material, a thickness of a portion on the display substrate may be smaller than a thickness of the portion covering the third portion of the circuit board.

The surface of the first sealing material may be on the same plane as a top surface of the optical layer.

The first sealing material may have a recessed portion on a bottom surface of the portion covering the third portion.

The display device may further include a protective film layer on the top surface of the first sealing material.

The display device may further include an adhesive layer between the top surface of the first sealing material and the protective film layer.

A top surface of the protective film layer and a top surface of the optical layer may be on the same plane.

The display device may further include a frame on the top surface of the first sealing material and the side surface of the portion covering the third portion.

The display device may further include an adhesive layer between the top surface of the first sealing material and the frame.

The display substrate may include a circuit layer, a display layer on the display area of the circuit layer, and an overcoat layer on the display layer, the optical layer may be directly on the overcoat layer, and the first sealing material may directly contact one side surfaces of the display layer, the overcoat layer, and the optical layer.

At least some of the first sealing material may be directly on the circuit board in the pad area, and a thickness of a portion of the first sealing material directly on the circuit board may be smaller than or equal to the sum of thicknesses of the display layer, the overcoat layer, and the optical layer.

The first sealing material may include a light blocking material.

According to an embodiment of the present disclosure, a display device includes: a display substrate having a display area and a pad area on one side of the display area in a first direction; an optical layer on the display area of a first surface of the display substrate; a plurality of circuit boards on the pad area of the display substrate and spaced apart from the optical layer in the first direction; and a first sealing material on the pad area of the display substrate to cover the circuit boards. The circuit boards have: a first portion attached to the first surface of the display substrate, a second portion bent downwardly from the first surface and attached to another surface of the display substrate, and a third portion bent between the first portion and the second portion. The first sealing material protrudes from one side of the display substrate in the first direction to cover at least some of the first portion and the third portion of the circuit boards and is not between the circuit boards and the display substrate.

A width of the first sealing material in a second direction crossing the first direction may be the same as a width of the display substrate in the second direction.

The first sealing material may have a top surface and one lateral side in the first direction, and the top surface and the one lateral side of the first sealing material may be flat.

The first sealing material may be not on the other surface of the display substrate.

BRIEF DESCRIPTION OF THE DRAWINGS

The above and other aspects and features of the present disclosure will become more apparent by describing, in detail, embodiments thereof with reference to the attached drawings, in which:

FIGS. 7 to 9 are cross-sectional views illustrating a process of manufacturing a display device according to one embodiment;

FIGS. 36 to 38 are cross-sectional views illustrating the manufacturing process of the display device shown in FIG. 34;

DETAILED DESCRIPTION

Figure 1:
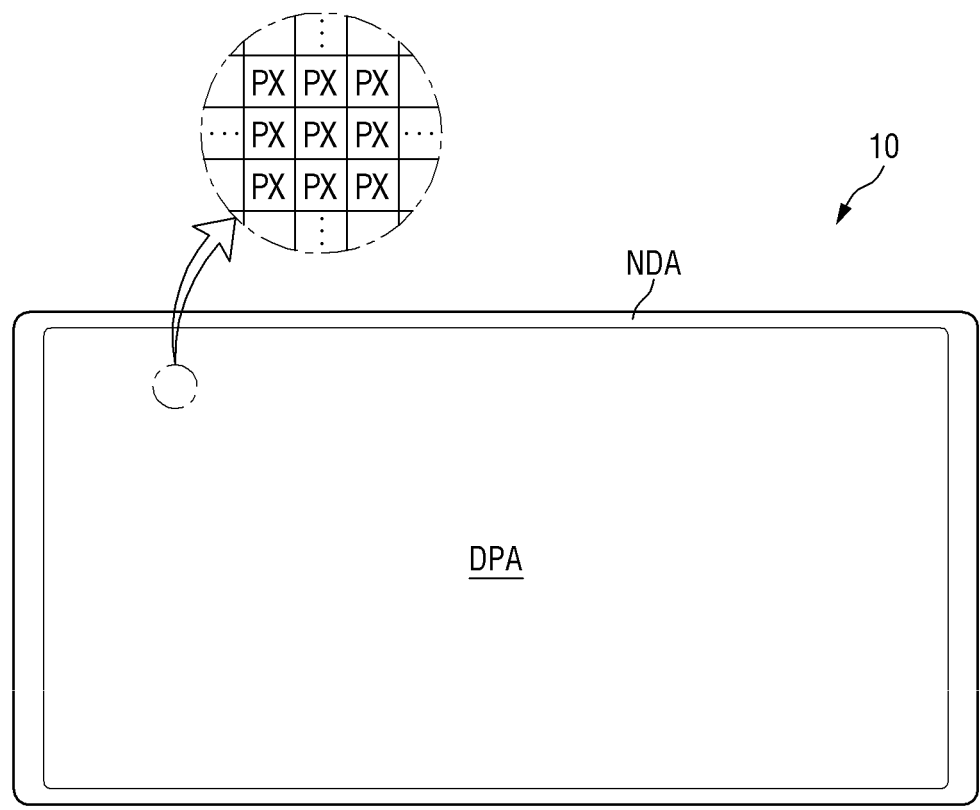
FIG. 1 is a schematic plan view of a display device according to one embodiment.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the present disclosure. Similarly, the second element could also be termed the first element.

In the figures, dimensions of the various elements, layers, etc. may be exaggerated for clarity of illustration. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize,"

"utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments will be described with reference to the accompanying drawings.

FIG. 1 is a schematic plan view of a display device according to one embodiment.

Referring to FIG. 1, a display device 10 displays (e.g., is configured to display) a moving image or a still image. The display device 10 may refer to any electronic device providing (or including) a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides (or includes) a display screen. Examples of the display panel may include an inorganic light emitting diode display panel, an organic light emitting display panel, a quantum dot light emitting display panel, a plasma display panel, and a field emission display panel. In the following description, an inorganic light emitting diode display panel is shown as an example of a display panel, but the present disclosure is not limited thereto and other display panels may be applied within the same scope of technical spirit.

The shape of the display device 10 may be variously modified. For example, the display device 10 may have a rectangular shape elongated in a horizontal direction, a rectangular shape elongated in a vertical direction, a square shape, a quadrilateral shape with rounded corners (e.g., vertices), another polygonal shape, and a circular shape. The shape of a display area DPA of the display device 10 may be similar to the overall shape of the display device 10. In FIG. 1, the display device 10 is illustrated as having a rectangular shape elongated in a second direction DR2.

The display device 10 may include the display area DPA and a non-display area NDA. The display area DPA is an area where a screen (e.g., an image) can be displayed, and the non-display area NDA is an area where a screen (e.g., an image) is not displayed. The display area DPA may also be referred to as an active region, and the non-display area NDA may also be referred to as a non-active region. The display area DPA may substantially occupy the center of the display device 10.

The display area DPA may include a plurality of pixels PX. The plurality of pixels PX may be arranged in a matrix. The shape of each pixel PX may be a rectangular or square shape in a plan view. However, the present disclosure is not limited thereto, and each pixel PX may have a rhombic shape in which each side is inclined with respect to one direction. The pixels PX may be arranged in a stripe type (or stripe arrangement) or an island type (or island arrangement). In addition, each of the pixels PX may include one or more light emitting elements that emit light of a specific wavelength band to display a specific color.

The non-display area NDA may be disposed around the display area DPA. The non-display area NDA may completely or partially surround (e.g., may completely or partially extend around a periphery of) the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA or external devices may be mounted thereon.

Figure 2:
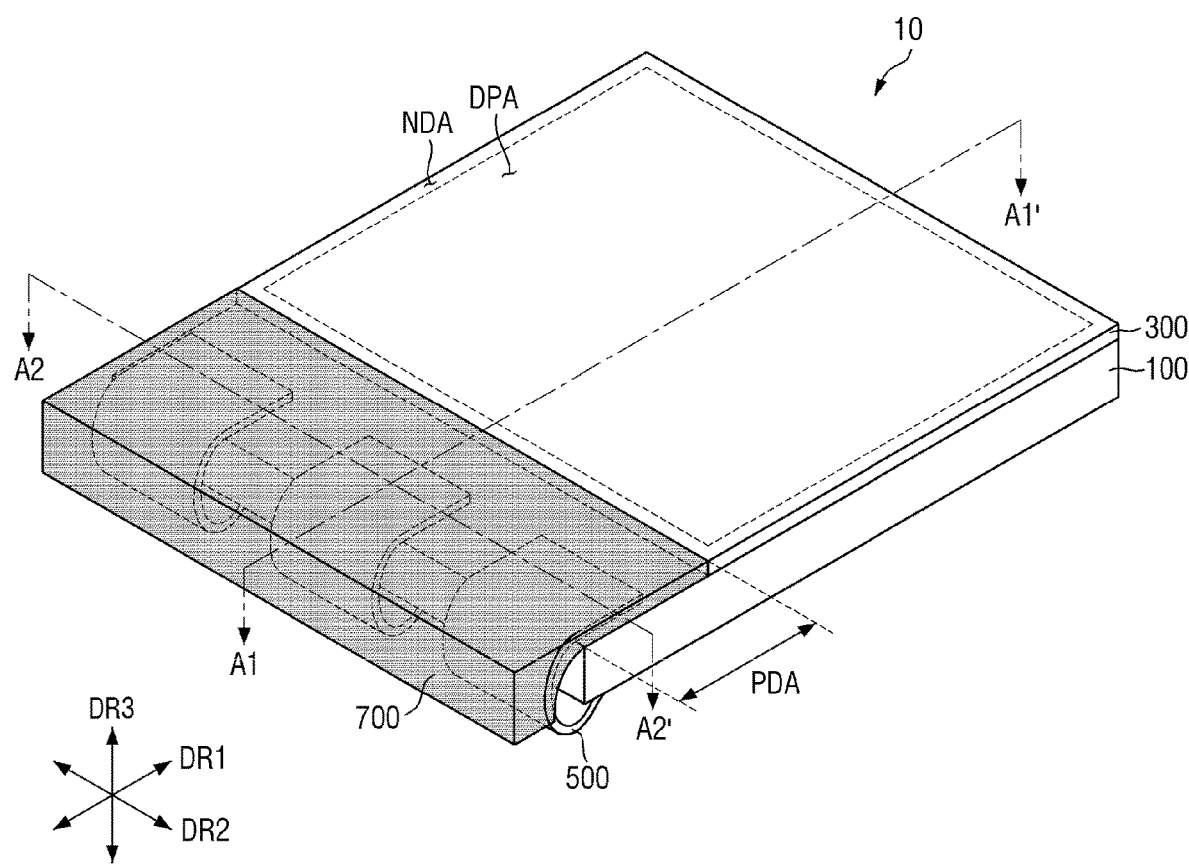
FIG. 2 is a perspective view of the display device shown in FIG. 1.
Figure 3:
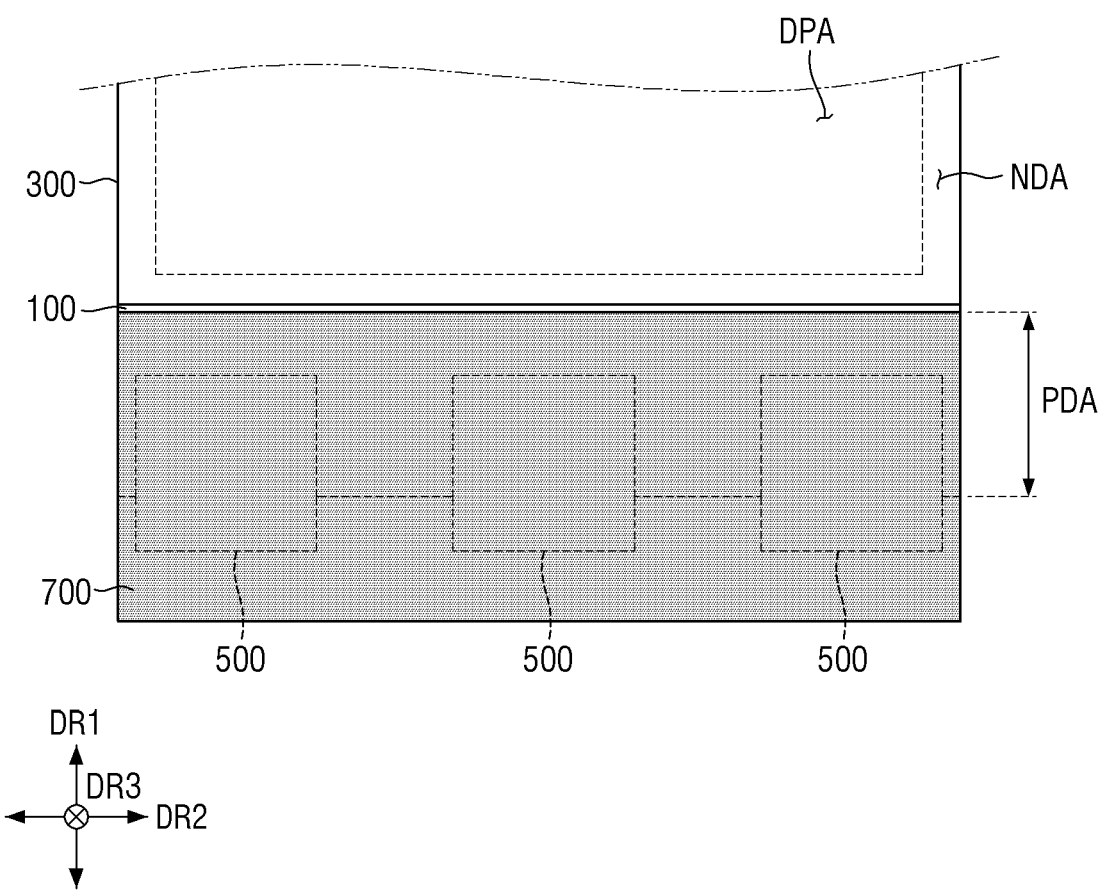
FIG. 3 is a plan view of a part of the display device shown in FIG. 2 viewed from the top.
Figure 4:
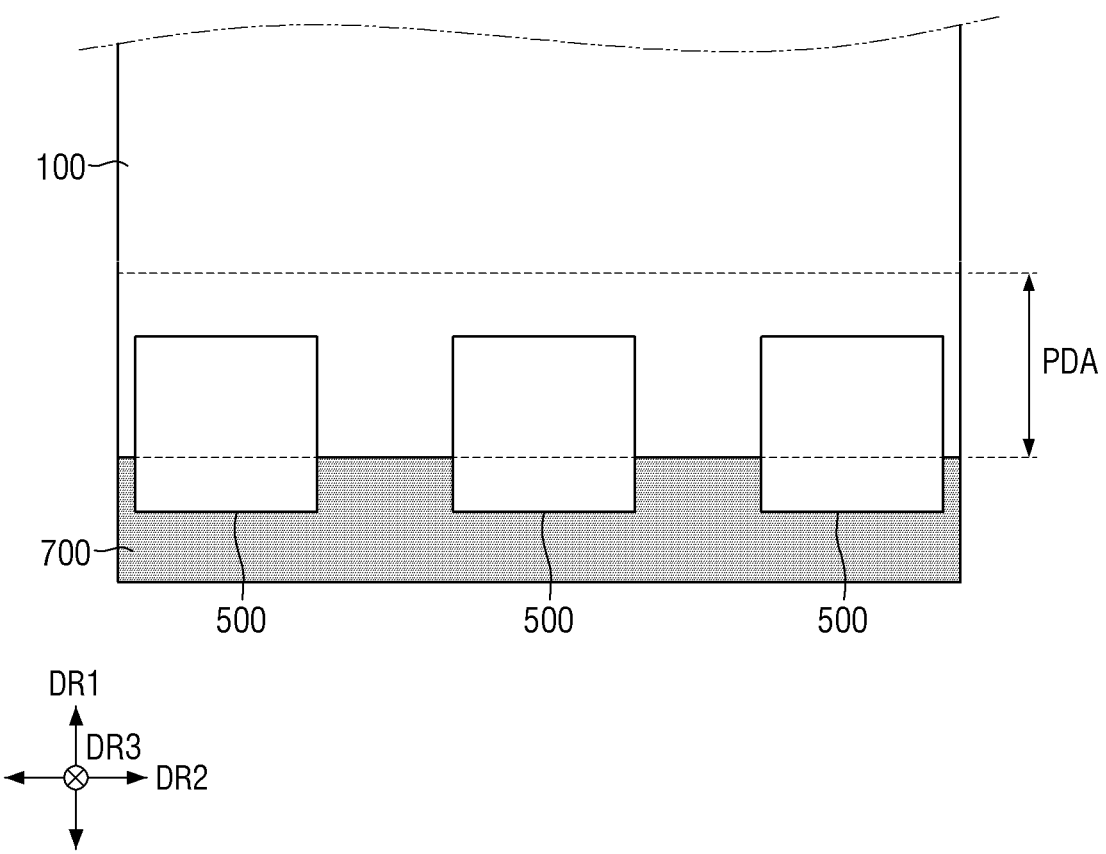
FIG. 4 is a plan view of a part of the display device shown in FIG. 2 viewed from the bottom.
Figure 5:
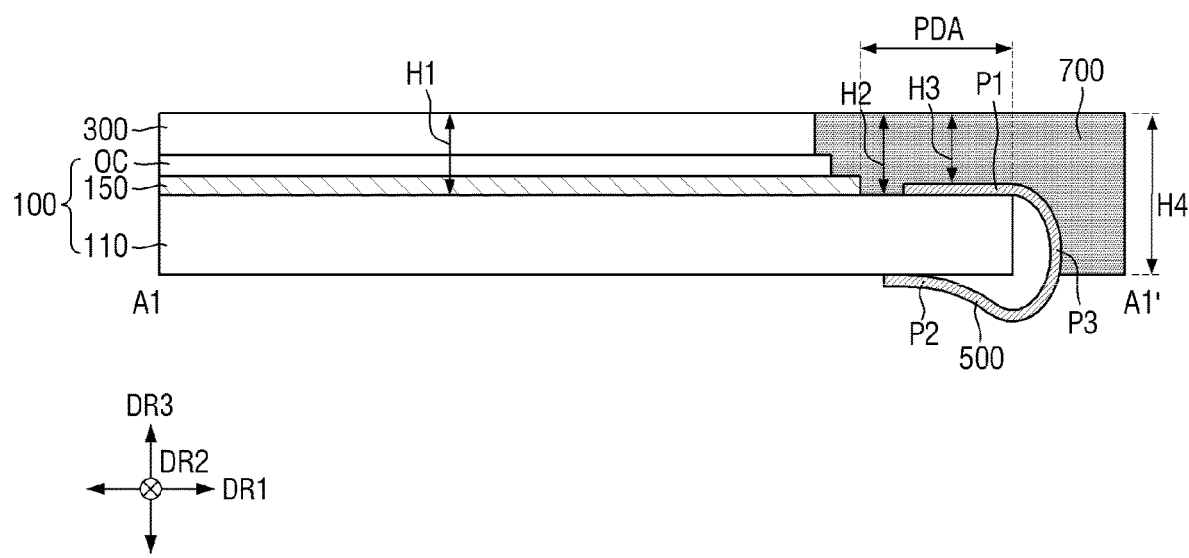
FIG. 5 is a cross-sectional view taken along the line A1-A1' of FIG. 2.
Figure 6:
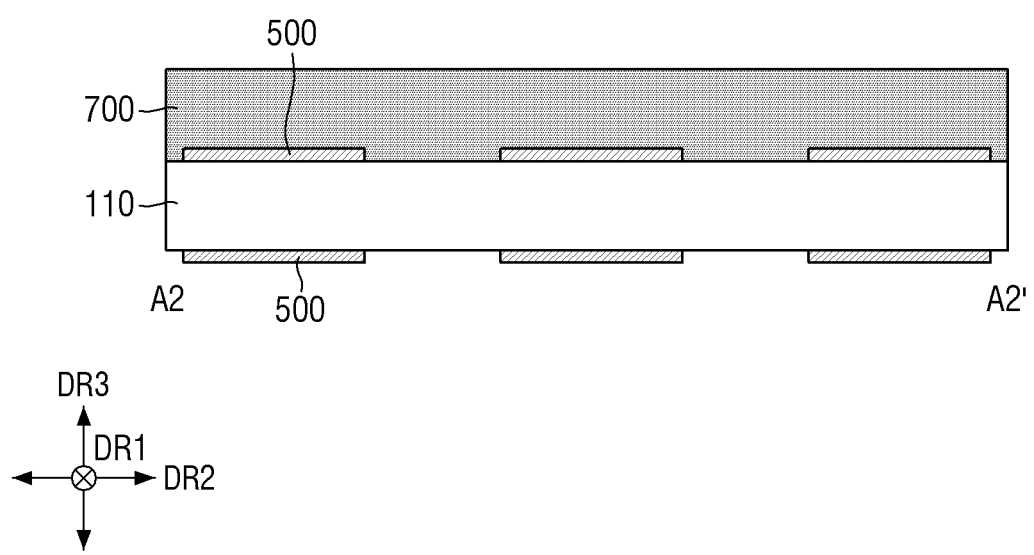
FIG. 6 is a cross-sectional view taken along the line A2-A2' of FIG. 2.

FIG. 2 is a perspective view of the display device of FIG. 1. FIG. 3 is a plan view of a part of the display device shown in FIG. 2 viewed from the top. FIG. 4 is a plan view of a part of the display device shown in FIG. 2 viewed from the bottom. FIG. 5 is a cross-sectional view taken along the line A1-A1' of FIG. 2. FIG. 6 is a cross-sectional view taken along the line A2-A2' of FIG. 2.

FIG. 3 illustrates a plan view of a pad area PDA of the display device 10 viewed from the front surface, and FIG. 4 illustrates a plan view of the pad area PDA of the display device 10 viewed from the rear surface. FIG. 5 illustrates a cross section across the display device 10 in a first direction DR1, and FIG. 6 illustrates a cross section across the pad area PDA of the display device 10 in the second direction DR2.

Referring to FIGS. 2 to 6, the display device 10 according to one embodiment may include a display substrate 100, an optical layer 300, a plurality of circuit boards 500, and a first sealing material 700.

The display substrate 100 may have the display area DPA and the non-display area NDA and may also have the pad area PDA disposed on the lower side, that is, the other side in the first direction DR1, which is at one side of the display area DPA in the non-display area NDA. The plurality of pixels PX may be disposed in the display area DPA of the display substrate 100 and may emit light or display a screen. The non-display area NDA, that is, an outer area of the display area DPA, may surround the display area DPA. The plurality of wires included in the display substrate 100 may be disposed in the non-display area NDA.

The pad area PDA may be disposed on one side of the display substrate 100, and at least one circuit board 500 may be disposed in the pad area PDA. The pixels PX disposed in the display area DPA are not disposed in the pad area PAD, and pad electrodes electrically connected to a driver disposed on the circuit board 500 may be disposed in the pad area PDA.

The display substrate 100 may include a circuit substrate 110, a display layer 150, and an overcoat layer OC. The circuit substrate 110 may include wires and circuit elements connected to the plurality of pixels PX of the display substrate 100, and the display layer 150 may include display elements disposed in the plurality of pixels PX to emit light. The overcoat layer OC may be disposed on the display layer 150 to cover and protect the display layer 150. The structure of the plurality of pixels PX included in the display substrate 100 will be described, in detail, later with reference to other drawings.

The optical layer 300 may be disposed on the display substrate 100. For example, the optical layer 300 may be disposed to cover at least the display area DPA of the display substrate 100 and may be directly disposed on the overcoat layer OC of the display substrate 100. The optical layer 300 may be attached to the display substrate 100 through an optically clear adhesive (OCA) film or an optically clear resin (OCR). In one embodiment, the optical layer 300 may include a phase retardation film, such as a linear polarizer plate, and a quarter-wave (λ/4) plate. The phase retardation film and the linear polarizer plate may be sequentially stacked on the overcoat layer OC of the display substrate 100.

The circuit board 500 may be disposed on the pad area PDA of the display substrate 100. For example, one surface of the circuit board 500 may be attached to the pad area PDA of the display substrate 100 through an anisotropic conductive film (ACF), and lead lines of the circuit board 500 may be electrically connected to pads disposed in the pad area PDA of the display substrate 100. In some embodiments, the circuit board 500 may be a flexible printed circuit board, a printed circuit board, or a flexible film, such as a chip-on-film (COF). Although the illustrated embodiment includes three circuit boards 500 disposed in the pad area PDA located on the lower side of the display area DPA of the display device 10, the present disclosure is not limited thereto. The number and arrangement of the circuit boards 500 included in the display device 10 may be variously modified different from those shown in FIG. 2.

One side of the circuit board 500 may be attached to the top surface of the circuit substrate 110 on which the display layer 150 is disposed, which is one surface of the display substrate 100, and the other side of the circuit board 500 may be bent toward the rear surface, which is the other surface opposite to the one surface of the display substrate 100, and attached to the rear surface. The circuit board 500 may have a first portion P1 attached to the top surface of the display substrate 100, a second portion P2 attached to the rear surface of the display substrate 100, and a third portion P3 that is bent from the top surface of the display substrate 100 toward the bottom surface of the display substrate 100. The first portion P1 and the second portion P2 of the circuit board 500 may be disposed to overlap only the pad area PDA of the display substrate 100. The first portion P1 of the circuit board 500 may be disposed on the top surface of the display substrate 100 to be spaced apart from the display layer 150 and the overcoat layer OC, and the second portion P2 may be disposed without overlapping the display layer 150 and the overcoat layer OC in a third direction DR3, that is, a thickness direction. However, in some embodiments, the second portion P2 of the circuit board 500 may further extend to the inside of the display area DPA from the rear surface of the display substrate 100 to partially overlap the display layer 150.

The first sealing material 700 may be disposed on the display substrate 100 in the pad area PDA of the display device 10. The first sealing material 700 may cover the circuit boards 500 disposed in the pad area PDA and may partially contact the circuit substrate 110 of the display substrate 100. The first sealing material 700 may also be disposed on a portion of the top surface of the circuit substrate 110 where the display layer 150 and the circuit boards 500 are not disposed and may directly contact a part of the top surface of the circuit substrate 110. The width of the first sealing material 700 measured in the first direction DR1 may be greater than the pad area PDA, so that one side of the first sealing material 700 may protrude from (e.g., protrude off of or beyond) one side of the display substrate 100. Further, the width of the first sealing material 700 measured in the second direction DR2 may be the same as the width of the display substrate 100 in the second direction DR2 so that the first sealing material 700 may completely cover the pad area PDA.

The first sealing material 700 may also contact the side surfaces of the display layer 150, the overcoat layer OC, and the optical layer 300 disposed on the circuit substrate 110. The first sealing material 700 may directly contact the circuit substrate 110, the display layer 150, and the layers disposed thereon to prevent or substantially prevent peeling off thereof and may be disposed to cover the exposed side surface of the display layer 150 to prevent or substantially prevent external air from permeating into the display layer 150.

In accordance with one embodiment, a portion of the first sealing material 700 disposed on the display substrate 100 may be directly disposed on the first portion P1 of the circuit board 500, and a portion of the first sealing material 700 protruding toward one side from the display substrate 100 may cover a part of the bent third portion P3 of the circuit board 500. The first sealing material 700 may include the portion disposed on the display substrate 100 and the portion protruding from the display substrate 100 to cover the outer sides of the circuit boards 500. The first sealing material 700 may have a shape including a portion covering the pad area PDA of the display substrate 100 and a portion protruding from the display substrate 100 and extending downward in cross-sectional view (see, e.g., FIG. 5). The first sealing material 700 may also protect the third portions P3 of the circuit boards 500 that are bent downward in the pad area PDA of the display substrate 100.

Further, in accordance with one embodiment, the first sealing material 700 may have a flat outer surface. In the first sealing material 700, at least one surface extending in the same direction as the top surface of the optical layer 300 and the outer surface of the portion covering the third portion P3 of the circuit board 500 may be formed to be flat. In some embodiments, the top surface of the first sealing material 700 may be formed to be in parallel to the top surface of the optical layer 300, and the top surfaces thereof may be located on the same plane. A first side surface of the first sealing material 700 on one side in the first direction DR1 may be parallel to the lower side surface of the display substrate 100, and a second side surface of the first sealing material 700 on the other side of in the first direction DR1 may have a partially stepped shape due to the shapes of the display layer 150, the overcoat layer OC, and the optical layer 300 of the display device 10. In an embodiment in which the display device 10 further includes another layer disposed on the first sealing material 700, the other layer may be stably disposed on the flat surface of the first sealing material 700. Further, the first sealing material 700 may compensate for (e.g., may planarize) the stepped portion formed by the circuit boards 500 disposed in the pad area PDA of the display substrate 100 so that the stepped portion formed by the circuit boards 500 may not be visually recognized from the outside of the display device 10.

In the display device 10, a first thickness H1, that is, the total thickness of the display layer 150, the overcoat layer OC, and the optical layer 300 of the display substrate 100, may be greater than or equal to a second thickness H2 of the portion of the first sealing material 700 that is directly disposed on the display substrate 100. In FIG. 5, the first thickness H1 and the second thickness H2 are illustrated as being the same. Because the top surface of the first sealing material 700 is formed to be located on the same plane as the top surface of the optical layer 300, the first thickness H1 and the second thickness H2 may be the same. Accordingly, in the display device 10, the boundary between the first sealing material 700 and the display layer 150, the overcoat layer OC, and the optical layer 300 of the display device 10 may not be visually recognized from the outside. However, the present disclosure is not limited thereto, and the second thickness H2 of the first sealing material 700 may vary depending on other members further disposed in the display device 10.

Because the first sealing material 700 is disposed to cover the circuit boards 500 and to protect the third portion P3 of the circuit board 500, the first sealing material 700 may have a shape with partially different (e.g., with varying) thicknesses. In an embodiment, in the first sealing material 700, the second thickness H2 of the portion directly disposed on the display substrate 100 may be greater than a third thickness H3 of a portion directly disposed on the first portion P1 of the circuit board 500. Further, in the first sealing material 700, the second thickness H2 may be smaller than a fourth thickness H4 of a portion protruding from the lower side of the display substrate 100 and covering the outer side of the third portion P3 of the circuit board 500. The first sealing material 700 may compensate for the stepped portion formed by the circuit boards 500 disposed thereunder to flatten (e.g., to planarize) the top surface of the portion disposed on the display substrate 100. Therefore, the second thickness H2 and the third thickness H3 of the first sealing material 700 may be different from each other. Further, the fourth thickness H4 may be greater than the second thickness H2 so that the first sealing material 700 may cover the bent third portion P3 of the circuit board 500. One side of the first sealing material 700 in the first direction DR1 may be positioned to be spaced apart from the lower lateral side of the display substrate 100, and the one side may have the thickness H4 greater than those of other portions.

However, the first sealing material 700 may not be disposed between the circuit board 500 and the display substrate 100. The first sealing material 700, which is disposed only at the outer side of the circuit board 500, may be disposed at the outer sides of the first portion P1 and the third portion P3 and may not be disposed between the third portion P3 of the circuit board 500 and the lower side surface of the display substrate 100. The circuit board 500 may be bent from the top surface toward the bottom surface of the display substrate 100, and the third portion P3 may be spaced apart from the lower lateral side of the display substrate 100 in the first direction DR1. Even when the first sealing material 700 covers the outer surface of the circuit board 500, the space between the display substrates 100 of the circuit board 500 may not be filled.

The structure and arrangement of the first sealing material 700 may be related to the structure of a mold 1000 (see, e.g., FIG. 7) used in the manufacturing process of the display device 10. The display device 10 may be manufactured by a process of preparing the display substrate 100, on which the optical layer 300 and the circuit board 500 are disposed in the mold 1000, and injecting a material constituting the first sealing material 700 into the mold 1000. In some embodiments, the first sealing material 700 may be formed to cover the top surface of the display substrate 100 and cover the third portion P3 of the circuit board 500 due to the arrangement of the display substrate 100 on which the optical layer 300 and the circuit board 500 are disposed.

Figure 7:
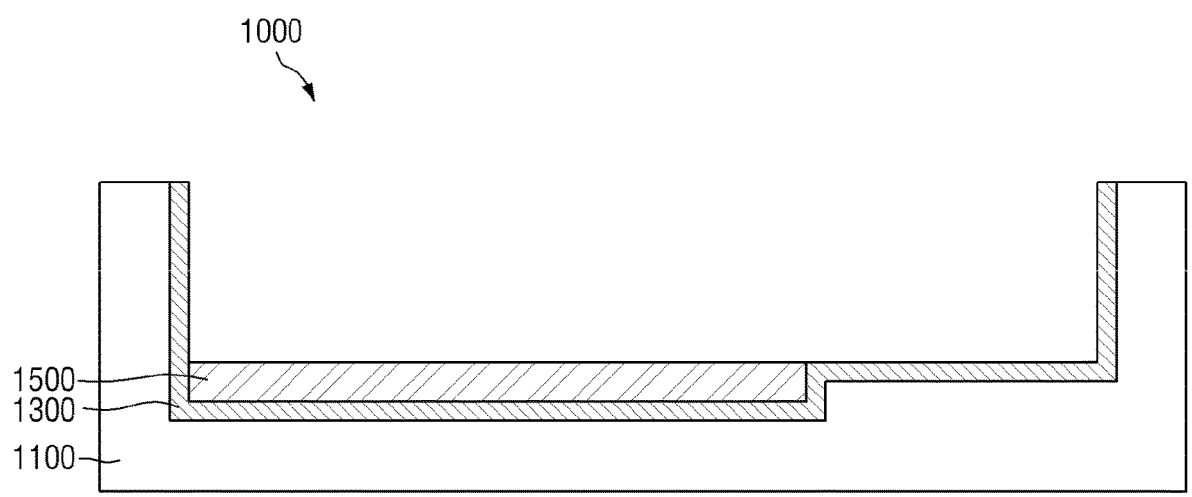
Figure 9:
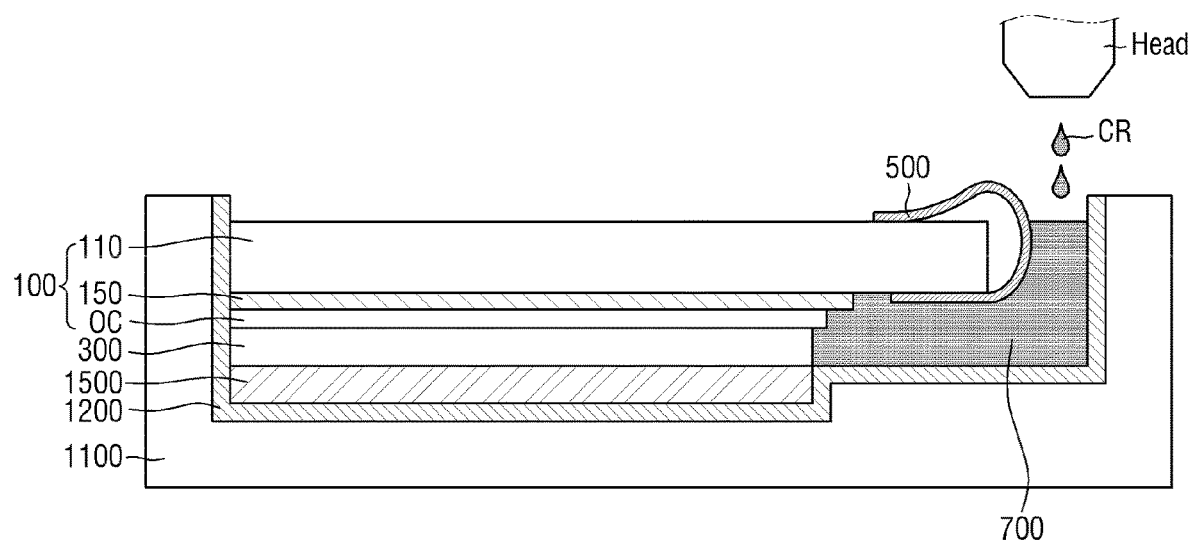

FIGS. 7 to 9 are cross-sectional views illustrating a process of manufacturing a display device according to one embodiment. FIGS. 7 to 9 are views explaining a process of forming the first sealing material 700.

First, referring to FIG. 7, a process of forming the first sealing material 700 by using the mold 1000 may be performed. The mold 1000 may include a main body 1100, a release paper 1300, and a passivation layer 1500.

The main body 1100 may have a bottom surface and sidewalls disposed at the outer side of the bottom surface. The main body 1100 may have a structure forming a space capable of accommodating (e.g., configured to accommodate) the display device 10. For example, the main body 1100 may have the bottom surface and the sidewalls to form a space in which the material constituting the first sealing material 700 of the display device 10 is to be disposed. The structure of the first sealing material 700 of the display device 10 may be determined depending on the shape of the space formed by the main body 1100. In one embodiment, the main body 1100 may include (or may be made of) a material such as glass, quartz, polymer resin, or the like. In one embodiment, the main body 1100 has a high degree of flatness (e.g., is made of a material having a high degree of flatness, such as glass), so that the top surface and the side surfaces of the first sealing material 700 of the display device 10 may be formed to be flat.

Further, the bottom surface of the main body 1100 may be partially recessed to have a stepped portion. The inner space of the main body 1100 may have different depths or heights depending on positions with respect to the top surfaces of the sidewalls, which have a set (or predetermined) height. A lower portion of the bottom surface of the main body 1100 may be a portion in contact with the optical layer 300 of the display device 10, and a higher (or upper) portion of the bottom surface of the main body 1100 may be a portion facing the pad area PDA of the display substrate 100 and a portion into which the material of the first sealing material 700 is injected. The shape of the first sealing material 700 may vary depending on the structure of the space formed by the sidewalls and the higher portion of the bottom surface of the main body 1100. Although the structure in which the bottom surface and the sidewalls of the main body 1100 form a right angle is illustrated in the drawing, the present disclosure is not limited thereto.

The release paper 1300 may be disposed on the inner lateral side of the main body 1100. The release paper 1300 may assist smooth separation of the display device 10 disposed in the main body 1100 from the main body 1100 after the completion of the manufacturing process of the display device 10. For example, the release paper 1300 may be made of a material including (or containing) fluorine (F). The release paper 1300 may be formed as a separate layer and attached to the inner side of the main body 1100. However, the present disclosure is not limited thereto, and the release paper 1300 may be formed by depositing fluorine-based precursors on the inner sidewalls of the main body 1100.

The passivation layer 1500 may be disposed on the release paper 1300 on the bottom surface of the main body 1100. On the bottom surface of the main body 1100 in which the stepped portion is formed, the passivation layer 1500 may be disposed on the lower portion and may not be disposed on the higher portion. The passivation layer 1500 may prevent the material constituting the first sealing material 700 from flowing into an undesired region while compensating for (e.g., planarizing) the stepped portion formed by the bottom surface of the main body 1100. As will be described later, the passivation layer 1500 may be disposed to correspond to the optical layer 300 of the display device 10. The passivation layer 1500 may fix the optical layer 300 while directly contacting the optical layer 300 and may prevent the material constituting the first sealing material 700 from flowing onto one surface of the optical layer 300. In one embodiment, the passivation layer 1500 may include (or contain) an adhesive component. For example, the passivation layer 1500 may be a UV tape or a double-sided tape. The passivation layer 1500 may fix the display device 10 prepared in the main body 1100 and may guide the material constituting the first sealing material 700 to be positioned in a space (e.g., a predetermined space).

When the mold 1000 used in the manufacturing process of the display device 10 is prepared, the display substrate 100 is prepared and the optical layer 300 and the circuit board 500 are disposed on the display substrate 100. The display substrate 100 includes the circuit substrate 110, the display layer 150, and the overcoat layer OC as described above. In the display substrate 100, a plurality of layers are sequentially disposed on a first substrate SUB (see, e.g., FIG. 12), and they may be formed on the first substrate SUB by consecutive processes. When the display substrate 100 is prepared, the optical layer 300 is disposed on the display area DPA of the display substrate 100 and the circuit board 500 is disposed on the pad area PDA. The optical layer 300 may be disposed on the overcoat layer OC of the display substrate 100, and the circuit board 500 may have one side attached to the pad area PDA of the display substrate 100 and the other side attached to the bottom surface of the display substrate 100.

Next, referring to FIG. 8, the display substrate 100 on which the optical layer 300 and the circuit board 500 are disposed is disposed in the mold 1000. The display substrate 100 on which the optical layer 300 and the circuit board 500 are disposed may be disposed such that the top surface of the optical layer 300 faces the bottom surface of the main body 1100 of the mold 1000. For example, the display substrate 100 may be prepared in an upside-down state in the mold 1000. The top surface of the optical layer 300 may be fixed while being in contact with the top surface of the passivation layer 1500 of the mold 1000. The display substrate 100 may be disposed such that the top surface faces the release paper 1300 disposed on the bottom surface of the main body 1100 and the bottom surface faces the upper side.

The display substrate 100 may be disposed in the main body 1100 in a state where the portion on which the optical layer 300 is not disposed is spaced apart from the release paper 1300 disposed in the main body 1100. A portion of the main body 1100 on which the passivation layer 1500 is not disposed may be spaced apart from the display substrate 100, and a space may be formed therebetween.

Further, the height of the sidewall of the main body 1100 of the mold 1000 may be greater than the total thickness of the display substrate 100 and the optical layer 300 of the display device 10. When the display substrate 100 on which the optical layer 300 and the circuit board 500 are disposed is prepared in the main body 1100, the outer surface of the circuit board 500 disposed to surround (e.g., to extend around) one side of the display substrate 100 may face the release paper 1300 disposed on the sidewall of the main body 1100. The circuit board 500 may be disposed to be spaced apart from the release paper 1300, and a material constituting the first sealing material 700 may be injected into the space therebetween.

Next, referring to FIG. 9, the material constituting the first sealing material 700 is injected into the space between the display substrate 100 and the main body 1100. The first sealing material 700 may include (or may be made of) a first resin composition CR having a viscosity, and the first resin composition CR may be cured to form the first sealing material 700. For example, the first sealing material 700 may include an organic material, such as an epoxy-based resin composition, an acrylic resin composition, and a urethane-based resin composition, or an inorganic material, such as a silicone-based resin composition. The first resin composition CR may be cured in a subsequent process to form the first sealing material 700. The first sealing material 700 may include (or may be made of) a transparent material including the above-described materials.

The first resin composition CR having a viscosity before curing may be injected into the main body 1100 by a printing process using an inkjet head. The first resin composition CR may be injected into the space between the main body 1100 and the display substrate 100 to fill the space. The first resin composition CR may be in direct contact with the display substrate 100, the optical layer 300 (e.g., a side of the optical layer 300), and the circuit board 500 while filling the space between the top surface of the display substrate 100 on which the optical layer 300 is disposed and the main body 1100 or the release paper 1300.

Further, the first resin composition CR may be injected to fill the area between the bent portion of the circuit board 500 disposed on one side of the display substrate 100 and the main body 1100. Because the first resin composition CR is a fluid, even if the first resin composition CR is injected into the space where the circuit board 500 and the release paper 1300 are spaced apart from each other, the space between the top surface of the display substrate 100 and the bottom surface of the main body 1100 may be completely filled.

In one embodiment, however, the first resin composition CR may not fill the space between the circuit board 500 and the display substrate 100. The first resin composition CR may be a fluid but may have a viscosity that does not allow it to flow into the space between the circuit board 500 and the display substrate 100. When the first resin composition CR is cured to form the first sealing material 700 in the subsequent process, the first sealing material 700 may cover the top surface of the circuit board 500 and the outer surface of the bent portion of the circuit board 500 but may not cover the space between the circuit board 500 and the display substrate 100. In an embodiment, the first resin composition CR or the first sealing material 700 may have a viscosity within a range of about 10 cps to about 1000 cps, for example, about 100 cps, before curing. The first resin composition CR having a viscosity within the above-described range may fill the space between the display substrate 100 and the main body 1100 or the release paper 1300 and the space between the circuit board 500 and the release paper 1300 but may not fill the space between the circuit board 500 and the display substrate 100.

Next, the display device 10 including the first sealing material 700 formed by curing the first resin composition CR is manufactured and separated from the mold 1000. Because the display device 10 is disposed on the release paper 1300 in the main body 1100, the display device 10 may be easily separated from the main body 1100. Because the first resin composition CR is injected into the space between the display substrate 100 and the release paper 1300 and the space between the circuit board 500 and the release paper 1300, the first sealing material 700 may be disposed to cover the upper portion of the pad area PDA of the display substrate 100 and the outer surface of the bent portion (e.g., the third portion P3) on the outer surface of the circuit board 500. Further, because the display substrate 100 is disposed in an upside-down state in the main body 1100, the top surface and the lateral side of the first sealing material 700 may be formed to be flat along the bottom surface and the sidewall of the main body 1100.

The display device 10 according to one embodiment may include the first sealing material 700, which safely protects the circuit board 500 and has a flat surface, so that bending due to the lower stepped portion may not be present or may not be visually recognized from the outside. Further, the boundary between the optical layer 300 and another layer disposed on the first sealing material 700 may not be being visually recognized from the outside.

Hereinafter, the structure of the display substrate 100 of the display device 10 according embodiments will be described in detail with reference to other drawings.

Figure 10:
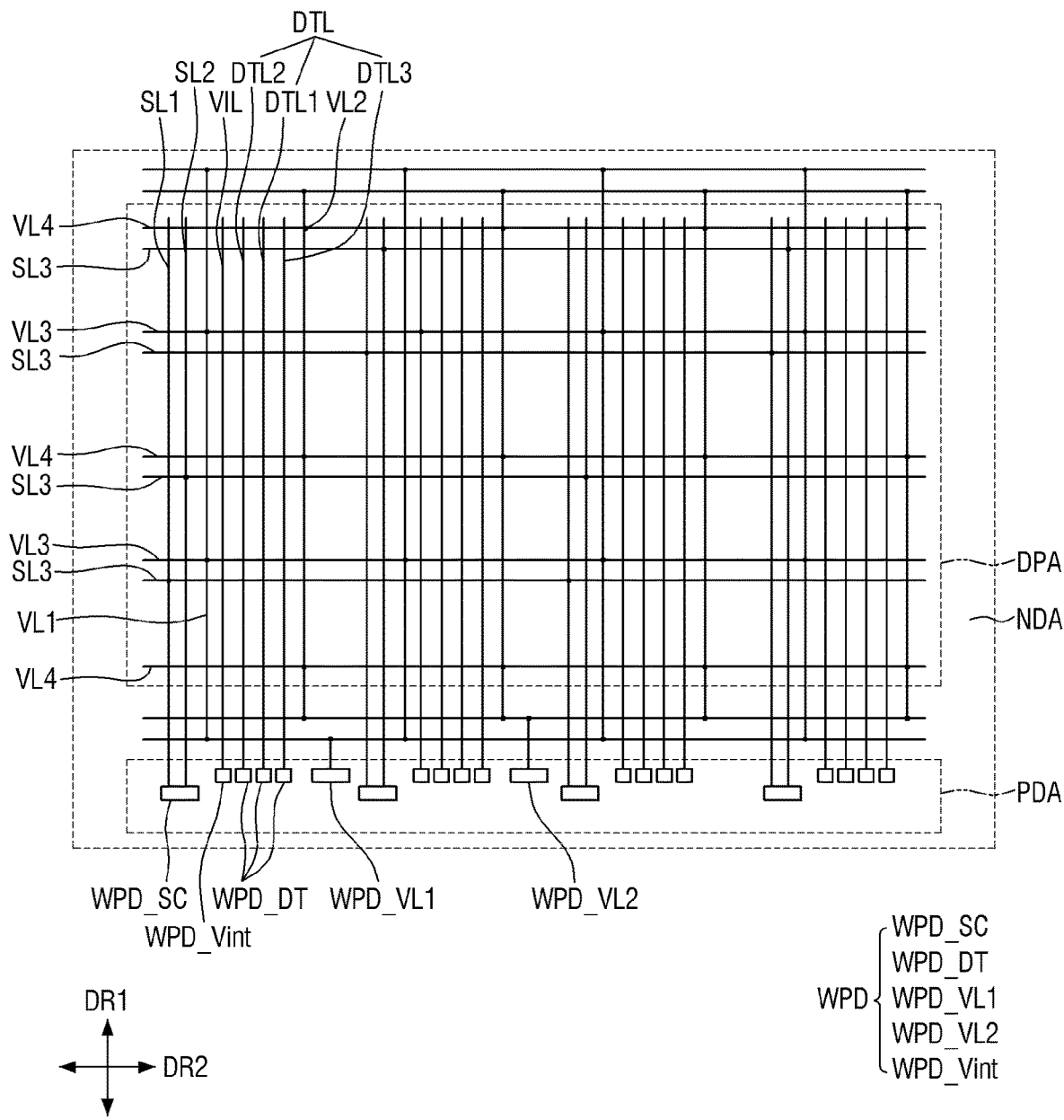
FIG. 10 is a plan view illustrating an arrangement of a plurality of wires included in a display substrate of a display device according to one embodiment.

FIG. 10 is a plan view illustrating an arrangement of a plurality of wires included in a display substrate of a display device according to one embodiment.

Referring to FIG. 10, the display substrate 100 of the display device 10 may include a plurality of wires. The display substrate 100 may include a plurality of scan lines SL1, SL2, and SL3, a plurality of data lines DTL1, DTL2, and DTL3, an initialization voltage line VIL, and a plurality of voltage lines VL1, VL2, VL3, and VL4. Other wires may be further provided in the display substrate 100.

The first scan line SL1 and the second scan line SL2 may extend in the first direction DR1. The first scan line SL1 and the second scan line SL2 may be disposed adjacent to each other and may be disposed to be spaced apart from the different first scan line SL1 and second scan line SL2 in the second direction DR2. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to the display area DPA.

The third scan line SL3 may extend in the second direction DR2 and may be disposed to be spaced apart from another third scan line SL3 in the first direction DR1. One third scan line SL3 may be connected to one or more first scan lines SL1 or one or more second scan lines SL2. In one embodiment, the first scan line SL1 and the second scan line SL2 may be formed as a conductive layer disposed on a different layer from the third scan line SL3. The plurality of scan lines SL1, SL2, and SL3 may have a mesh structure in (e.g., over) the entire surface of the display area DPA, but the present disclosure is not limited thereto.

As explained above, the term "connected" as used herein may indicate not only that one member is connected to another member through physical contact but also that one member is connected to another member through another member.

This may also be understood as one part and the other part as integral elements being connected into an integrated element via another element. Furthermore, if one element is connected to another element, such connection may include an electrical connection via another element in addition to a direct, physical connection.

The data lines DTL1, DTL2, and DTL3 may extend in the first direction DR1. The data lines DTL1, DTL2, and DTL3 include a first data line DTL1, a second data line DTL2, and a third data line DTL3, and each one of the first to third data lines DTL1, DTL2, and DTL3 forms a pair and is disposed adjacent to each other. Each of the data lines DTL1, DTL2, and DTL3 may extend from the pad area PDA disposed in the non-display area NDA to the display area DPA. However, the present disclosure is not limited thereto, and the plurality of data lines DTL1, DTL2, and DTL3 may be spaced apart from each other at equal intervals between the first voltage line VL1 and the second voltage line VL2, to be described later.

The initialization voltage line VIL may extend in the first direction DR1. The initialization voltage line VIL may be disposed between the data lines DTL1, DTL2, and DTL3 and the first scan line SL1 and the second scan line SL2. The initialization voltage line VIL may extend from the pad area PDA disposed in the non-display area NDA to the display area DPA.

The first voltage line VL1 and the second voltage line VL2 may extend in the first direction DR1, and the third voltage line VL3 and the fourth voltage line VL4 may extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may extend in the first direction DR1 to cross the display area DPA, and as for the third voltage line VL3 and the fourth voltage line VL4, some of the wires may be disposed in the display area DPA and others of the wires may be disposed in the non-display area NDA positioned on both sides of the display area DPA in the first direction DR1, respectively. The first voltage line VL1 and the second voltage line VL2 may be formed as a conductive layer disposed on a different layer from the third voltage line VL3 and the fourth voltage line VL4. The first voltage line VL1 may be connected to at least one third voltage line VL3, the second voltage line VL2 may be connected to at least one fourth voltage line VL4, and the plurality of voltage lines may have a mesh structure in (e.g., over) the entire display area DPA. However, the present disclosure is not limited thereto.

The first scan line SL1, the second scan line SL2, the data lines DTL1, DTL2, and DTL3, the initialization voltage line VIL, the first voltage line VL1, and the second voltage line VL2 may be electrically connected to at least one line pad WPD. Each line pad WPD may be disposed in the non-display area NDA. In one embodiment, each of the line pads WPD may be disposed in the pad area PDA positioned on the lower side, which is the other side, of the display area DPA in the first direction DR1. The first scan line SL1 and the second scan line SL2 are connected to the scan line pad WPD_SC disposed in the pad area PDA, and the plurality of data lines DTL1, DTL2, and DTL3 are connected to the data line pads WPD_DT different from each other, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding, or the like. In the drawing, it is shown that each of the line pads WPD is disposed on the pad area PDA disposed on the lower side of the display area DPA, but the present disclosure is not limited thereto. Some of the plurality of line pads WPD may be disposed in any one area on the upper side or on the left and right sides of the display area DPA.

Each pixel PX or sub-pixel SPXn (n is an integer of 1 to 3) of the display substrate 100 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one embodiment, in each sub-pixel SPXn, the pixel driving circuit may have a 3T1C structure including three transistors and one capacitor. Hereinafter, the pixel driving circuit having the 3T1C structure will be described as an example, but the present disclosure is not limited thereto and various other suitable structures, such as a 2T1C structure, a 7T1C structure, and a 6T1C structure, may be applied.

Figure 11:
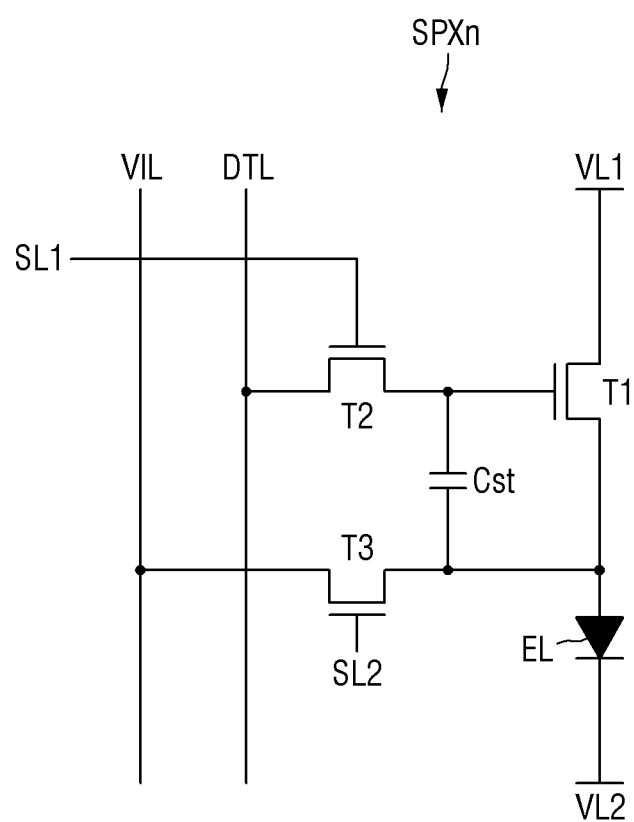
FIG. 11 is an equivalent circuit diagram of one sub-pixel of a display substrate of a display device according to one embodiment.

FIG. 11 is an equivalent circuit diagram of one sub-pixel of a display substrate of a display device according to one embodiment.

Referring to FIG. 11, each sub-pixel SPXn of the display substrate 100 according to one embodiment includes three transistors T1, T2, and T3 and one storage capacitor Cst in addition to a light emitting diode EL.

The light emitting diode EL emits light by (e.g., according to) a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1, to which the first power voltage is applied.

The second transistor T2 is turned on by a scan signal of a first scan line SL1 to connect the data lines DTL1, DTL2, and DTL3 (e.g., one of the data lines DTL1, DTL2, and DTL3) to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data lines DTL1, DTL2, and DTL3.

The third transistor T3 is turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

The source electrode and the drain electrode of each of the transistors T1, T2, and T3 are not limited to those described above and vice versa. Further, each of the transistors T1, T2, and T3 may be a thin film transistor. In addition, in FIG. 11, each of the transistors T1, T2, and T3 has been described as being an N-type metal oxide semiconductor field effect transistor (MOSFET), but it is not limited thereto. For example, each of the transistors T1, T2, and T3 may be a P-type MOSFET. In some embodiments, some of the transistors T1, T2, and T3 may be an N-type MOSFET and the others may be a P-type MOSFET.

The storage capacitor Cst is formed between the gate electrode and the source electrode of the first transistor T1. The storage capacitor Cst stores a voltage difference between a gate voltage and a source voltage of the first transistor T1.

Figure 12:
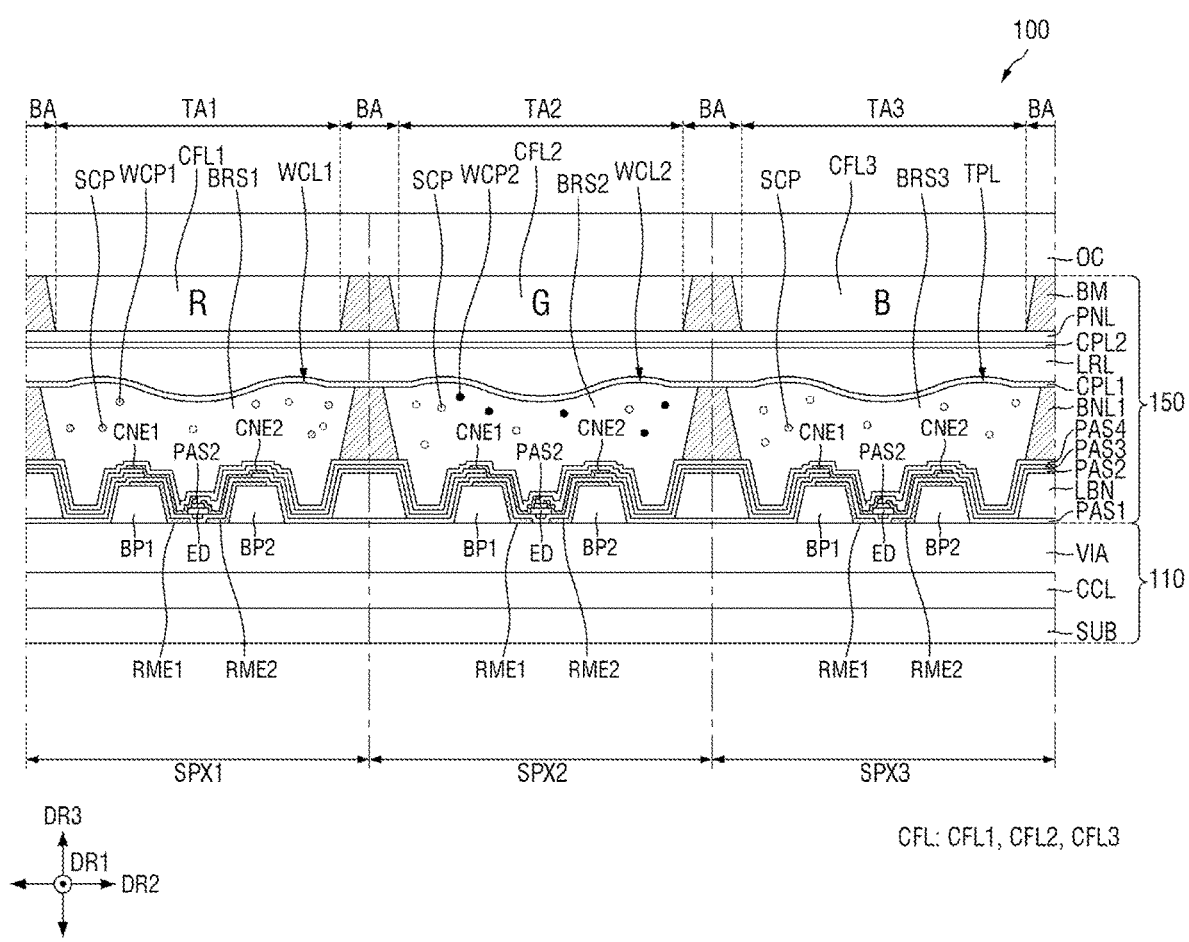
FIG. 12 is a cross-sectional view across one pixel included in a display substrate of a display device according to one embodiment.
Figure 13:
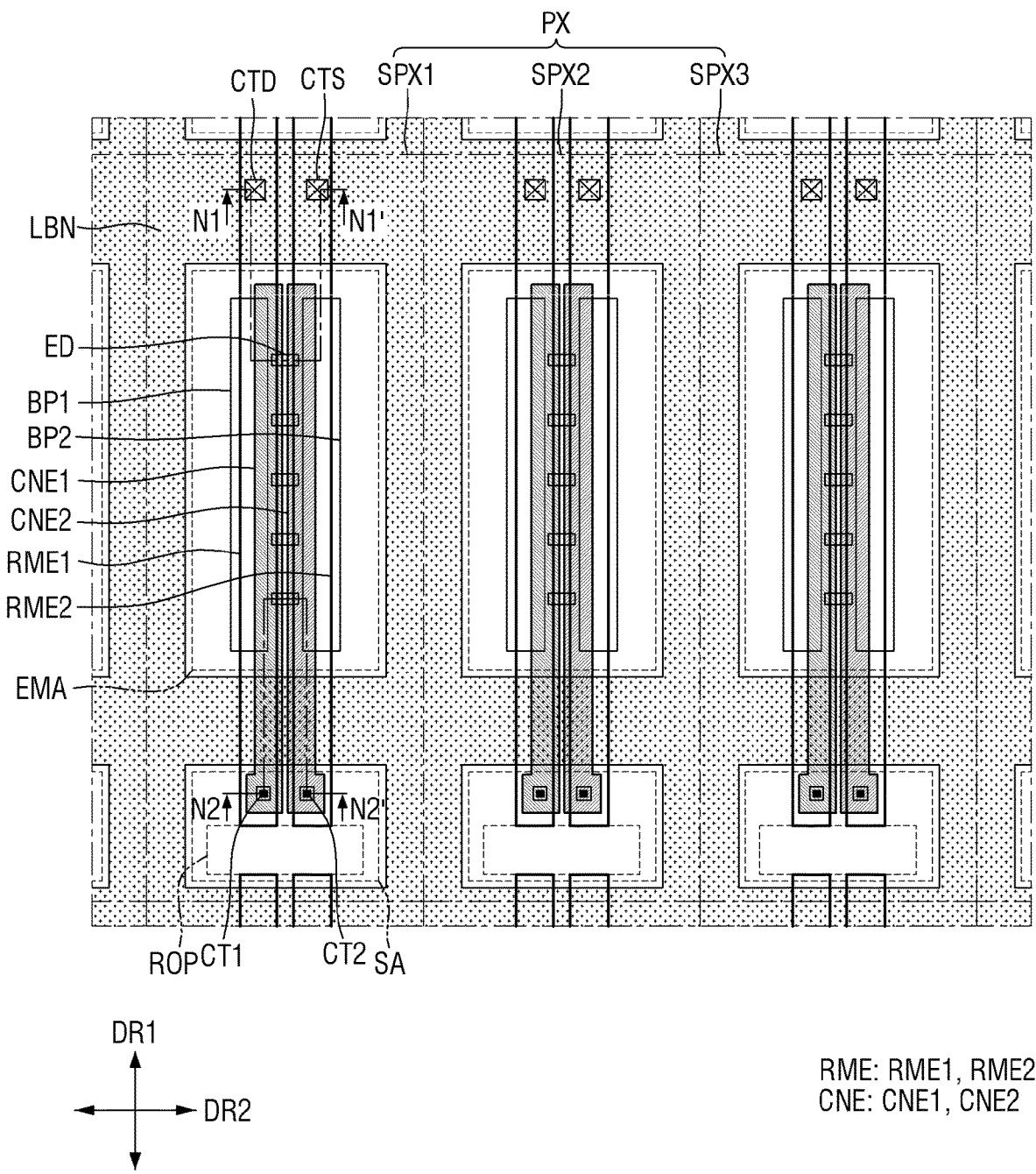
FIG. 13 is a plan view showing one pixel of a display layer included in a display substrate according to one embodiment.

FIG. 12 is a cross-sectional view across one pixel included in a display substrate of a display device according to one embodiment. FIG. 13 is a plan view showing one pixel of a display layer included in a display substrate according to one embodiment.

FIG. 12 is a cross section across one pixel PX of the display substrate 100 in the second direction DR2, and FIG. 13 illustrates a planar arrangement of electrodes RME (RME1 and RME2), bank patterns BP1 and BP2, a lower bank layer LBN, a plurality of light emitting elements ED, and connection electrodes CNE (CNE1 and CNE2) of the display layer 150 disposed in one pixel PX of the display substrate 100.

Referring to FIGS. 12 and 13, the display substrate 100 of the display device 10 according to one embodiment may include the circuit substrate 110, the display layer 150, and the overcoat layer OC. The circuit substrate 110 includes the first substrate SUB and a circuit layer CCL and a via layer VIA disposed on the first substrate SUB, the display layer 150 is disposed on the via layer VIA of the circuit substrate 110, and the overcoat layer OC is disposed on the display layer 150. The display layer 150 may include a light emitting unit including the plurality of electrodes RME (RME1 and RME2) and the light emitting elements ED, color control structures TPL, WCL1, and WCL2 and color filter layers CFL (CFL1, CFL2, and CFL3) disposed on the light emitting unit. The circuit layer CCL and the via layer VIA of the circuit substrate 110 and the display layer 150 may be sequentially disposed on the first substrate SUB.

Each of the plurality of pixels PX of the display substrate 100 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one embodiment, each of the sub-pixels SPXn may emit blue light. Although it is illustrated in the drawing that one pixel PX includes three sub-pixels SPXn, the present disclosure is not limited thereto, and the pixel PX may include a larger number of sub-pixels SPXn.

Each sub-pixel SPXn may include an emission area EMA and a non-emission area. The emission area EMA may be an area in which the light emitting element ED is disposed to emit light. The non-emission area may be a region in which the light emitting element ED is not disposed and a region from which light is not emitted because light emitted from the light emitting element ED does not reach it.

The emission area EMA may include a region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The plurality of light emitting elements ED may be disposed in the respective sub-pixels SPXn, and the emission area EMA may include an area where the light emitting elements ED are disposed and an area adjacent thereto.

Although it is shown in the drawing that the sub-pixels SPXn have the emission areas EMA that are substantially identical in size, the present disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different sub-pixels SPXn, which are spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the present disclosure is not limited thereto, and the arrangement of the emission areas EMA and the sub-regions SA in the pixels PX may be different from that shown in FIG. 13.

Light may not be emitted from the sub-region SA because the light emitting element ED is not disposed in the sub-region SA. An electrode RME disposed in each sub-pixel SPXn may be partially disposed in the sub-region SA. The electrodes RME disposed in different sub-pixels SPXn may be disposed to be separated at a separation portion ROP of the sub-region SA.

The wires and the circuit elements of the circuit layer CCL may be connected to the first to third sub-pixels SPX1, SPX2, and SPX3. However, the wires and the circuit elements may not be disposed to correspond to the area occupied by each sub-pixel SPXn or the emission area EMA and may be disposed regardless of the position of the emission area EMA within one pixel PX.

The lower bank layer LBN may be disposed to surround (e.g., to extend around a periphery of) the plurality of sub-pixels SPXn, the emission area EMA, and the sub-region SA. The lower bank layer LBN may be disposed at the boundary between the sub-pixels SPXn adjacent in the first direction DR1 and the second direction DR2 and may also be disposed at the boundary between the emission area EMA and the sub-region SA. The sub-pixels SPXn, the emission area EMA, and the sub-region SA of the display device 10 may be the areas distinguished by the arrangement of the lower bank layer LBN. The gaps between the plurality of sub-pixels SPXn, the emission areas EMA, and the sub-regions SA may vary depending on the width of the lower bank layer LBN.

The lower bank layer LBN may have portions extending in the first direction DR1 and the second direction DR2 in a plan view to be arranged in a grid pattern over the entire surface of the display area DPA. The lower bank layer LBN may be disposed along the boundaries between the sub-pixels SPXn to delimit the neighboring sub-pixels SPXn. The lower bank layer LBN may also be arranged to surround (e.g., extend around a periphery of) the emission area EMA and the sub-region SA disposed for each sub-pixel SPXn to delimit them from each other.

Figure 14:
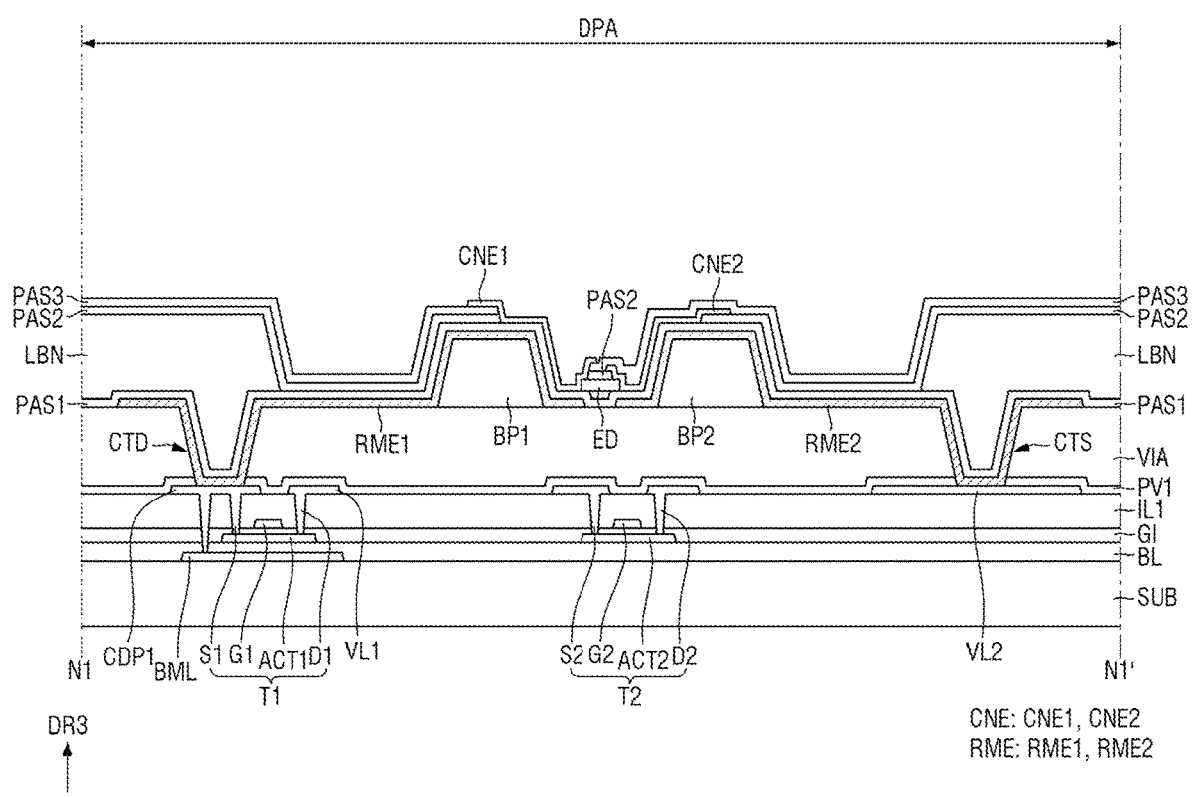
FIG. 14 is a cross-sectional view taken along the line N1-N1' of FIG. 13.
Figure 15:
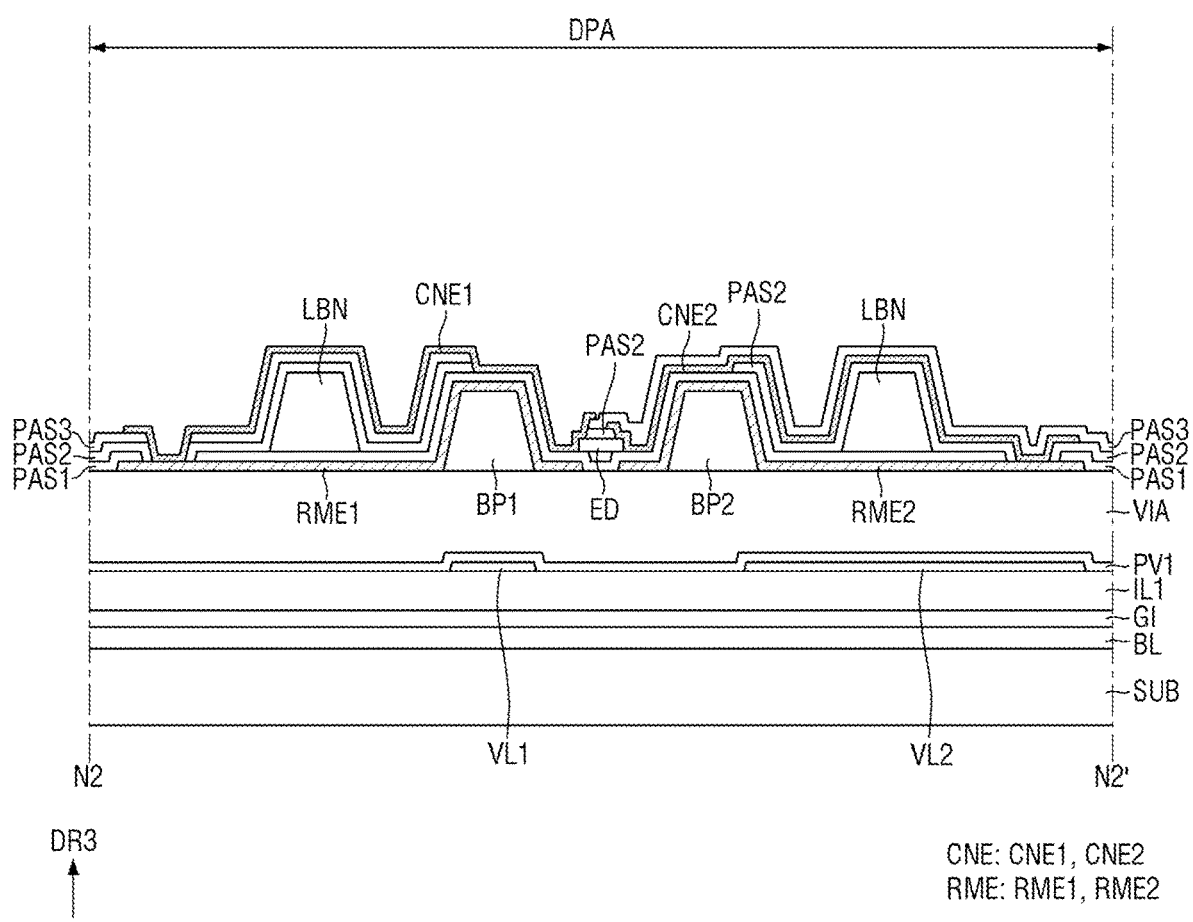
FIG. 15 is a cross-sectional view taken along the line N2-N2' of FIG. 13.

FIG. 14 is a cross-sectional view taken along the line N1-N1' of FIG. 13, and FIG. 15 is a cross-sectional view taken along the line N2-N2' of FIG. 13. FIG. 14 illustrates a cross section across both ends of the light emitting element ED and electrode contact holes (e.g., electrode contact openings) CTD and CTS disposed in the first sub-pixel SPX1, and FIG. 15 illustrates a cross section across both ends of the light emitting element ED and contact portions CT1 and CT2 disposed in the first sub-pixel SPXn.

Referring to FIGS. 14 and 15, in conjunction with FIGS. 12 and 13, the display substrate 100 may include the first substrate SUB, and a semiconductor layer, a plurality of conductive layers, and a plurality of insulating layers that are disposed on the first substrate SUB. The semiconductor layer, the conductive layers, and the insulating layers may constitute the circuit substrate 110 and the display layer 150 of the display substrate 100.

The first substrate SUB may be an insulating substrate. The first substrate SUB may include (or may be made of) an insulating material, such as glass, quartz, or polymer resin. Further, the first substrate SUB may be a rigid substrate but may be, in some embodiments, a flexible substrate that can be bent, folded or rolled. The first substrate SUB may include the display area DPA and the non-display area NDA surrounding (e.g., extending around a periphery of) the display area DPA, and the display area DPA may include the emission area EMA and the sub-region SA that is a part of the non-emission area.

A first conductive layer may be disposed on the first substrate SUB. The first conductive layer includes a lower metal layer BML that is disposed to overlap an active layer ACT1 of a first transistor T1. The lower metal layer BML may include a material for blocking light to prevent or substantially prevent light from reaching the active layer ACT1 of the first transistor T1. However, in some embodiments, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB, which may susceptible to moisture permeation, and may provide a planar upper surface (e.g., may perform a surface planarization function).

The semiconductor layer is disposed on the buffer layer BL. The semiconductor layer may include the first active layer ACT1 of the first transistor T1 and the second active layer ACT2 of the second transistor T2. The first active layer ACT1 and the second active layer ACT2 may be disposed to partially overlap the first gate electrode G1 and the second gate electrode G2 of the second conductive layer, respectively, to be described later.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor including (or containing) indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although an embodiment in which one first transistor T1 and one second transistor T2 are disposed in the sub-pixel SPXn of the display device 10 is illustrated, the present disclosure is not limited thereto. The display device 10 may include a larger number of transistors.

The first gate insulating layer GI is disposed on the semiconductor layer and the buffer layer BL. The first gate insulating layer GI may act3 as a gate insulating layer of each of the transistors T1 and T2.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in the third direction DR3, that is, the thickness direction, and the second gate electrode G2 may be disposed to overlap the channel region of the second active layer ACT2 in the third direction DR3. In some embodiments, the second conductive layer may further include one electrode of the storage capacitor.

A first interlayer insulating layer IL1 is disposed on the second conductive layer. The first interlayer insulating layer IL1 may act as an insulating film between the second conductive layer and other layers disposed thereon and may protect the second conductive layer.

A third conductive layer is disposed on the first interlayer insulating layer IL1. The third conductive layer may include the first voltage line VL1 and the second voltage line VL2 disposed in the display area DPA, a first conductive pattern CDP, a source electrode S1 and a drain electrode D1 of the transistor T1, and a source electrode S2 and a drain electrode D2 of the transistor T2. In some embodiments, the third conductive layer may further include the other electrode of the storage capacitor.

The first voltage line VL1 may be applied with a high potential voltage (e.g., a first power voltage) transmitted to the first electrode RME1, and the second voltage line VL2 may be applied with a low potential voltage (e.g., a second power voltage) transmitted to the second electrode RME2. A part of the first voltage line VL1 may contact the first active layer ACT1 of the first transistor T1 through a contact hole (e.g., a contact opening) penetrating (e.g., extending through) the first interlayer insulating layer IL1 and the first gate insulating layer GI. The first voltage line VL1 may act as a first drain electrode D1 of the first transistor T1. The second voltage line VL2 may be directly connected to the second electrode RME2, to be described later.

The first conductive pattern CDP may contact the first active layer ACT1 of the first transistor T1 through a contact hole (e.g., a contact opening) penetrating the first interlayer insulating layer IL1 and the first gate insulating layer GI.

The first conductive pattern CDP may contact the lower metal layer BML through another contact hole (e.g., another contact opening). The first conductive pattern CDP may act as a first source electrode S1 of the first transistor T1. Further, the first conductive pattern CDP may be connected to the first electrode RME1 or the first connection electrode CNE1, to be described later. The first transistor T1 may transmit the first power voltage applied from the first voltage line VL1 to the first electrode RME1 or the first connection electrode CNE1.

The second source electrode S2 and the second drain electrode D2 may contact the active layer ACT2 of the second transistor T2 through contact holes (e.g., contact openings) penetrating the first interlayer insulating layer IL1 and the first gate insulating layer GI.

A first passivation layer PV1 is disposed on the third conductive layer. The first passivation layer PV1 may act as an insulating layer between the third conductive layer and other layers and may protect the third conductive layer.

The buffer layer BL, the first gate insulating layer GI, the first interlayer insulating layer IL1, and the first passivation layer PV1 described above may be formed of a plurality of inorganic layers stacked in an alternating manner. For example, the buffer layer BL, the first gate insulating layer GI, the first interlayer insulating layer IL1, and the first passivation layer PV1 may be formed as a double layer structure formed by stacking or as a multilayer structure formed by alternately stacking inorganic layers including at least one of silicon oxide (SiOx), silicon nitride (SiNx), or silicon oxynitride (SiOxNy). However, the present disclosure is not limited thereto, and the buffer layer BL, the first gate insulating layer GI, the first interlayer insulating layer IL1, and the first passivation layer PV1 may be formed as a single inorganic layer including (or containing) the above-described insulating material. Further, in some embodiments, the first interlayer insulating layer IL1 may include (or may be made of) an organic insulating material, such as polyimide (PI) or the like.

The second conductive layer and the third conductive layer may be formed as a single layer or as multiple layers including (or made of) any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A via layer VIA is disposed on the third conductive layer in the display area DPA. The via layer VIA may including (or contain) an organic insulating material, for example, polyimide (PI), and may compensate the stepped portion formed by the conductive layers disposed thereunder to provide a flat (or planar) top surface. However, in some embodiments, the via layer VIA may be omitted.

A plurality of bank patterns BP1 and BP2, a plurality of electrodes RME (RME1 and RME2), the lower bank layer LBN, the plurality of light emitting elements ED, and a plurality of connection electrodes CNE (CNE1 and CNE2) are disposed on the via layer VIA as (e.g., to form) the display layer 150. Further, a plurality of insulating layers PAS1, PAS2, PAS3, and PAS4 may be disposed on the via layer VIA.

The plurality of bank patterns BP1 and BP2 may be disposed in the emission area EMA of each sub-pixel SPXn. The bank patterns BP1 and BP2 may have a width (e.g., a predetermined width) in the second direction DR2 and may have a shape extending in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side with respect to the center of the emission area EMA, which is one side in the second direction DR2, and the second bank patterns BP2 may be disposed on the right side with respect to the center of the emission area EMA, which is the other side in the second direction DR2, while being spaced apart from the first bank pattern BP1. The first bank pattern BP1 and the second bank pattern BP2 may be alternately disposed along the second direction DR2 and may be disposed in an island-shaped pattern in the display area DPA. The plurality of light emitting elements ED may be arranged between the first bank pattern BP1 and the second bank pattern BP2.

The lengths of the first bank pattern BP1 and the second bank pattern BP2 in the first direction DR1 may be the same or may be smaller than the length of the emission area EMA, which is surrounded by the lower bank layer LBN, in the first direction DR1. The first bank pattern BP1 and the second bank pattern BP2 may be spaced apart from a portion of the lower bank layer LBN extending in the second direction DR2. However, the present disclosure is not limited thereto, and the bank patterns BP1 and BP2 may be integrated with the lower bank layer LBN or may partially overlap a portion of the lower bank layer LBN extending in the second direction DR2. In such embodiments, the lengths of the bank patterns BP1 and BP2 in the first direction DR1 may be greater than or equal to the length of the emission area EMA, which is surrounded by the lower bank layer LBN, in the first direction DR1.

The widths of the first bank pattern BP1 and the second bank pattern BP2 in the second direction DR2 may be the same. However, the present disclosure is not limited thereto, and they may have different widths. For example, one bank pattern may have a larger width than the other bank pattern, and the bank pattern having a larger width may be disposed across the emission areas EMA of different sub-pixels SPXn adjacent in the second direction DR2. In such an embodiment, in the bank pattern disposed across the plurality of emission areas EMA, a portion of the lower bank layer LBN extending in the first direction DR1 may overlap the second bank pattern BP2 in the thickness direction. Although an embodiment in which two bank patterns BP1 and BP2 having the same width are arranged for each sub-pixel SPXn is illustrated, the present disclosure is not limited thereto. The number and the shape of the bank patterns BP1 and BP2 may vary depending on the number or the arrangement structure of the electrodes RME.

The plurality of bank patterns BP1 and BP2 may be disposed on the via layer VIA. For example, each of the bank patterns BP1 and BP2 may be directly disposed on the via layer VIA and may have a structure in which least a part thereof protrudes with respect to the top surface of the via layer VIA. The protruding parts of the bank patterns BP1 and BP2 may have inclined or curved side surfaces, and the light emitted from the light emitting element ED may be reflected by the electrode RME disposed on the bank patterns BP1 and BP2 and emitted in the upward direction of the via layer VIA. Different from the embodiment illustrated in the drawings, the bank patterns BP1 and BP2 may have a shape of a semi-circle or semi-ellipse whose outer surface is curved in cross-sectional view. The bank patterns BP1 and BP2 may include an organic insulating material, such as polyimide (PI), but they are not limited thereto.

The plurality of electrodes RME (RME1 and RME2) have a shape extending in one direction and are disposed for each sub-pixel SPXn. The plurality of electrodes RME1 and RME2 may extend in the first direction DR1 to be disposed across the emission area EMA of the sub-pixel SPXn and the sub-region SA and may be disposed to be spaced apart from each other in the second direction DR2. The plurality of electrodes RME may be electrically connected to the light emitting element ED, to be described later. However, the present disclosure is not limited thereto, and the plurality of electrodes RME may not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA, and the second electrode RME2 is located on the right side with respect to the center of the emission area EMA while being spaced apart from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the lower bank layer LBN. The first electrode RME1 and the second electrode RME2 of different sub-pixels SPXn may be separated at the separation portion ROP in the sub-region SA of one sub-pixel SPXn.

Although an embodiment in which two electrodes RME have a shape extending in the first direction DR1 for each sub-pixel SPXn is illustrated, the present disclosure is not limited thereto. For example, the display device 10 may have a shape in which a greater number of electrodes RME are disposed in one sub-pixel SPXn or the electrodes RME are partially bent and have different widths depending on positions.

The first electrode RME1 and the second electrode RME2 may be arranged at least on the inclined surfaces of the bank patterns BP1 and BP2. In one embodiment, the widths of the plurality of electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be directly arranged on the via layer VIA so that the first electrode RME1 and the second electrode RME2 may be arranged on the same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover at least one side surfaces of the bank patterns BP1 and BP2 and may reflect the light emitted from the light emitting element ED.

The electrodes RME may directly contact the third conductive layer through the electrode contact holes CTD and CTS at portions overlapping the lower bank layer LBN between the emission area EMA and the sub-region SA. The first electrode contact hole CTD may be formed in an area at where the lower bank layer LBN and the first electrode RME1 overlap, and the second electrode contact hole CTS may be formed in an area at where the lower bank layer LBN and the second electrode RME2 overlap. The first electrode RME1 may contact the first conductive pattern CDP through the first electrode contact hole CTD, which penetrates the via layer VIA and the first passivation layer PV1. The second electrode RME2 may contact the second voltage line VL2 through the second electrode contact hole CTS, which penetrates the via layer VIA and the first passivation layer PV1. The first electrode RME1 may be electrically connected to the first transistor T1 through the first conductive pattern CDP so that the first power voltage may be applied to the first electrode RME1, and the second electrode RME2 may be electrically connected to the second voltage line VL2 so that the second power voltage may be applied to the second electrode RME2. However, the present disclosure is not limited thereto. In another embodiment, the electrodes RME1 and RME2 may not be electrically connected to the voltage lines VL1 and VL2 of the third conductive layer, respectively, and the connection electrode CNE, to be described later, may be directly connected to the third conductive layer.

The plurality of electrodes RME may include a conductive material having high reflectivity. For example, the electrodes RME may include (or contain) a metal, such as silver (Ag), copper (Cu), or aluminum (Al), or may include (or contain) an alloy including aluminum (Al), nickel (Ni), lanthanum (La), or the like. In some embodiments, the electrodes RME may have a structure in which a metal layer, such as titanium (Ti), molybdenum (Mo), and niobium (Nb) and the alloy are stacked. In some embodiments, the electrodes RME may be formed as a double layer structure or a multilayer structure formed by stacking at least one metal layer including (or made of) an alloy including aluminum (Al) and titanium (Ti), molybdenum (Mo), and niobium (Nb).

The present disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or each of the electrodes RME may be formed as one layer including them (e.g., including both of them). For example, each electrode RME may have a stacked structure of ITO/Ag/ITO, ITO/Ag/IZO, ITO/Ag/ITZO/IZO, or the like. The electrodes RME may be electrically connected to the light emitting element ED and may reflect some of the lights emitted from the light emitting element ED in an upward direction of the first substrate SUB.

The first insulating layer PAS1 may be disposed in the entire display area DPA and may be disposed on the via layer VIA and the plurality of electrodes RME. The first insulating layer PAS1 may protect the plurality of electrodes RME and insulate the different electrodes RME from each other. For example, the first insulating layer PAS1 is disposed to cover the electrodes RME before the lower bank layer LBN is formed so that it the electrodes RME are not damaged in a process of forming the lower bank layer LBN. In addition, the first insulating layer PAS1 may prevent or substantially prevent the light emitting element ED disposed thereon from being damaged by direct contact with other members.

In an embodiment, the first insulating layer PAS1 may have stepped portions such that the top surface thereof is partially depressed between the electrodes RME, which are spaced apart from each other in the second direction DR2. The light emitting element ED may be disposed on the top surface of the first insulating layer PAS1, where the stepped portions are formed, and thus, a space may remain between the light emitting element ED and the first insulating layer PAS1.

The lower bank layer LBN may be disposed on the first insulating layer PAS1. The lower bank layer LBN may include portions extending in the first direction DR1 and the second direction DR2 and may surround (e.g., may extend around a periphery of) the sub-pixels SPXn. The lower bank layer LBN may surround (e.g., may extend around a periphery of) and distinguish the emission area EMA and the sub-region SA of each sub-pixel SPXn and may also surround (e.g., may extend around a periphery of) the outermost part of the display area DPA and distinguish the display area DPA and the non-display area NDA. The lower bank layer LBN is disposed in the entire display area DPA to form a grid pattern, and the regions exposed by the lower bank layer LBN in the display area DPA may be the emission area EMA and the sub-region SA.

Similar to the bank patterns BP1 and BP2, the lower bank layer LBN may have a certain height. In some embodiments, the top surface of the lower bank layer LBN may be higher than that of the bank patterns BP1 and BP2, and the thickness of the bank layer BNL may be equal to or greater than that of the bank patterns BP1 and BP2. The lower bank layer LBN may prevent ink from overflowing to adjacent sub-pixels SPXn during an inkjet printing process during the manufacturing process of the display device 10. Similar to the bank patterns BP1 and BP2, the lower bank layer LBN may include an organic insulating material, such as polyimide.

The plurality of light emitting elements ED may be arranged in the emission area EMA. The light emitting elements ED may be disposed between the bank patterns BP1 and BP2 and may be arranged to be spaced apart from each other in the first direction DR1. In one embodiment, the plurality of light emitting elements ED may have a shape extending in one direction, and both ends thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the present disclosure is not limited thereto, and the light emitting element ED may extend in the second direction DR2 or in a direction oblique to the second direction DR2.

The plurality of light emitting elements ED may be arranged on the first insulating layer PAS1. The light emitting element ED may have a shape extending in one direction and may be disposed such that one direction in which the light emitting element ED extends is parallel to the top surface of the first substrate SUB. As will be described later, the light emitting element ED may include a plurality of semiconductor layers arranged along one direction in which the light emitting element ED extends, and the plurality of semiconductor layers may be sequentially arranged along the direction parallel to the top surface of the first substrate SUB. However, the present disclosure is not limited thereto, and the plurality of semiconductor layers may be arranged in the direction perpendicular to the first substrate SUB when the light emitting element ED has another suitable structure.

The light emitting elements ED disposed in each sub-pixel SPXn may emit light of different wavelength bands depending on a material constituting the semiconductor layer. However, the present disclosure is not limited thereto, and the light emitting elements ED arranged in each sub-pixel SPXn may include the semiconductor layer of the same material and may emit light of the same color.

The light emitting elements ED may be electrically connected to the electrodes RME and the conductive layers below the via layer VIA while being in contact with the connection electrodes CNE (CNE1 and CNE2) and may emit light of a specific wavelength band by receiving an electrical signal.

The second insulating layer PAS2 may be disposed on the plurality of light emitting elements ED, the first insulating layer PAS1, and the lower bank layer LBN. The second insulating layer PAS2 may include a pattern portion disposed on the plurality of light emitting elements ED while extending in the first direction DR1 between the bank patterns BP1 and BP2. The pattern portion is disposed to partially surround the outer surface of the light emitting element ED and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the second insulating layer PAS2 thereunder. Further, a part of the second insulating layer PAS2 may be disposed on the lower bank layer LBN and in the sub-regions SA.

The plurality of connection electrodes CNE (CNE1 and CNE2) may be disposed on the plurality of electrodes RME and the bank patterns BP1 and BP2. The plurality of connection electrodes CNE may have a shape extending in one direction and may be spaced apart from each other. Each of the connection electrodes CNE may contact the light emitting element ED and may be electrically connected to the third conductive layer.

The plurality of connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first bank pattern BP1. The first connection electrode CNE1 may partially overlap the first electrode RME1 and may be disposed across the emission area EMA and the sub-region SA over the lower bank layer LBN. The second connection electrode CNE2 may have a shape extending in the first direction DR1 and may be disposed on the second electrode RME2 or the second bank pattern BP2. The second connection electrode CNE2 may partially overlap the second electrode RME2 and may be disposed across the emission area EMA and the sub-region SA over the lower bank layer LBN. The first connection electrode CNE1 and the second connection electrode CNE2 may contact the light emitting elements ED and may be electrically connected to the electrodes RME or the conductive layer disposed thereunder.

For example, the first connection electrode CNE1 and the second connection electrode CNE2 may be disposed on the side surfaces of the second insulating layer PAS2 and may contact the light emitting elements ED. The first connection electrode CNE1 may partially overlap the first electrode RME1 and may contact one ends of the light emitting elements ED. The second connection electrode CNE2 may partially overlap the second electrode RME2 and may contact the other ends of the light emitting elements ED. The plurality of connection electrodes CNE are disposed across the emission area EMA and the sub-region SA. The connection electrodes CNE may contact the light emitting elements ED at portions disposed in the emission area EMA and may be electrically connected to the third conductive layer at portions disposed in the sub-region SA.

According to one embodiment, in the display device 10, the connection electrodes CNE may contact the electrodes RME through the contact portions CT1 and CT2 disposed in the sub-region SA. The first connection electrode CNE1 may contract the first electrode RME1 through the first contact portion CT1 penetrating the first insulating layer PAS1, the second insulating layer PAS2, and the third insulating layer PAS3 in the sub-region SA. The second connection electrode CNE2 may contact the second electrode RME2 through the second contact portion CT2 penetrating the first insulating layer PAS1 and the second insulating layer PAS2 in the sub-region SA. Each of the connection electrodes CNE may be electrically connected to the third conductive layer through each of electrodes RME. The first connection electrode CNE1 may be electrically connected to the first transistor T1 so that the first power voltage may be applied to the first connection electrode CNE1, and the second connection electrode CNE2 may be electrically connected to the second voltage line VL2 so that the second power voltage may be applied to the second connection electrode CNE2. Each connection electrode CNE may contact the light emitting element ED in the emission area EMA to transmit a power voltage to the light emitting element ED.

However, the present disclosure is not limited thereto. In some embodiments, the plurality of connection electrodes CNE may directly contact the third conductive layer and may be electrically connected to the third conductive layer through patterns other than the electrodes RME.

The connection electrodes CNE may include a conductive material. For example, the connection electrodes CNE may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 is disposed on the second connection electrode CNE2 and the second insulating layer PAS2. The third insulating layer PAS3 may be disposed on the entire second insulating layer PAS2 to cover the second connection electrode CNE2, and the first connection electrode CNE1 may be disposed on the third insulating layer PAS3. The third insulating layer PAS3 may be disposed on the entire via layer VIA except the region where the second connection electrode CNE2 is disposed. The third insulating layer PAS3 may insulate the first connection electrode CNE1 and the second connection electrode CNE2 to prevent direct contact therebetween.

The fourth insulating layer PAS4 may be disposed on the third insulating layer PAS3, the connection electrodes CNE1 and CNE2, and the lower bank layer LBN. The fourth insulating layer PAS4 may protect the layers disposed on the first substrate SUB. However, the fourth insulating layer PAS4 may be omitted.

Each of the first insulating layer PAS1, the second insulating layer PAS2, the third insulating layer PAS3, and the fourth insulating layer PAS4 described above may include an inorganic insulating material or an organic insulating material. For example, each of the first insulating layer PAS1, the second insulating layer PAS2, the third insulating layer PAS3, and the fourth insulating layer PAS4 may include an inorganic insulating material. In some embodiments, the first insulating layer PAS1, the third insulating layer PAS3, and the fourth insulating layer PAS4 may include an inorganic insulating material, and the second insulating layer PAS2 may include an organic insulating material. Each, or at least one, of the first insulating layer PAS1, the second insulating layer PAS2, the third insulating layer PAS3, and the fourth insulating layer PAS4 may have a structure in which a plurality of insulating layers are alternately or repeatedly stacked. In an embodiment, each of the first insulating layer PAS1, the second insulating layer PAS2, the third insulating layer PAS3, and the fourth insulating layer PAS4 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may include (or may be made of) the same material or different materials. In some embodiments, some of the insulating layer may include (or may be made of) the same material and some of them may include (or may be made of) different materials.

A first bank BNL1, the color control structures TPL, WCL1 and WCL2, a light blocking member BM, and the color filter layers CFL1, CFL2 and CFL3 may be disposed on the fourth insulating layer PAS4. Further, a plurality of capping layers CPL1 and CPL2, a low refractive layer LRL, and a planarization layer PNL may be disposed between the color control structures TPL, WCL1, and WCL2 and the color filter layers CFL1, CFL2, and CFL3. The overcoat layer OC may be disposed on the color filter layers CFL1, CFL2, and CFL3.

The display substrate 100 may have light transmitting areas TA1, TA2, and TA3 in which the color filter layers CFL1, CFL2, and CFL3 are disposed to emit light and a light blocking area BA disposed between the light transmitting areas TA1, TA2 and TA3 and in which light is not emitted. The light transmitting areas TA1, TA2, and TA3 may be located to correspond to a part of the emission area EMA of each sub-pixel SPXn, and the light blocking area BA may be an area other than the light transmitting areas TA1, TA2, and TA3. As will be described later, the light transmitting areas TA1, TA2, and TA3 and the light blocking area BA may be distinguished by a light blocking member BM.

The first bank BNL1 may be disposed on the fourth insulating layer PAS4 to overlap the lower bank layer LBN. The first bank BNL1 may be disposed in the form of a grid pattern having portions extending in the first and second directions DR1 and DR2 in a plan view. The first bank BNL1 may surround (e.g., may extend around a periphery of) the emission area EMA or a portion in which the light emitting elements ED are disposed. The first bank BNL1 may form an area in which the color control structures TPL, WCL1, and WCL2 are disposed.

The color control structures TPL, WCL1, and WCL2 may be disposed in an area surrounded by the first bank BNL1 on the fourth insulating layer PAS4. The color control structures TPL, WCL1, and WCL2 may be arranged in the light transmitting areas TA1, TA2, and TA3, which are surrounded by the first bank BNL1 to form an island-shaped pattern in the display area DPA. However, the present disclosure is not limited thereto, and the color control structures TPL, WCL1, and WCL2 may be arranged over the plurality of sub-pixels SPXn while extending in one direction to form a linear pattern.

In an embodiment in which the light emitting element ED of each sub-pixel SPXn emits the third color light (e.g., blue light), the color control structures TPL, WCL1, and WCL2 may include the first wavelength conversion layer WCL1 disposed in the first sub-pixel SPX1 to correspond to a first light transmitting area TA1, the second wavelength conversion layer WCL2 disposed in the second sub-pixel SPX2 to correspond to a second light transmitting area TA2, and the light transmitting layer TPL disposed in the third sub-pixel SPX3 to correspond to a third light transmitting area TA3.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may transmit the blue light of the third color incident from the light emitting element ED while converting the wavelength thereof. The first wavelength conversion layer WCL1 and the second wavelength conversion layer WCL2 may further include a scatterer SCP in (e.g., buried or contained in) each base resin, and the scatterer SCP may increase wavelength conversion efficiency.

The light transmitting layer TPL may include a third base resin BRS3 and the scatterer SCP in (e.g., buried or contained in) the third base resin BSR3. The light transmitting layer TPL transmits the blue light of the third color incident from the light emitting element ED while maintaining the wavelength thereof. The scatterers SCP of the light transmitting layer TPL may control an emission path of the light emitted through the light transmitting layer TPL. The light transmitting layer TPL may not include a wavelength conversion material.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin, urethane resin, and the like.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2, and BRS3 may include (or may be formed of) the same material, but the present disclosure is not limited thereto.

The first wavelength conversion material WCP1 may convert the blue light of the third color into the red light of the first color, and the second wavelength conversion material WCP2 may convert the blue light of the third color into the green light of the second color. The first wavelength conversion material WCP1 and the second wavelength conversion material WCP2 may be quantum dots, quantum bars, phosphors, or the like. Examples of the quantum dot may include group IV nanocrystal, group II-VI compound nanocrystal, group III-V compound nanocrystal, group IV-VI nanocrystal, and a combination thereof.

In some embodiments, the color control structures TPL, WCL1, and WCL2 may be formed by an inkjet printing process or a photoresist process. The color control structures TPL, WCL1, and WCL2 may be formed by a process of spraying or coating materials thereof into the area surrounded by the first bank BNL1 and then performing drying or exposure and development. For example, in an embodiment in which the color control structures TPL, WCL1, and WCL2 are formed by the inkjet printing process, the top surfaces of the respective layers of the color control structures TPL, WCL1, and WCL2 may be formed to be curved so that the edge portion adjacent to the first bank BNL1 may be higher than the central portion in the drawing. However, the present disclosure is not limited thereto. In an embodiment in which the color control structures TPL, WCL1, and WCL2 are formed by the photoresist process, the top surfaces of the respective layers of the color control structures TPL, WCL1, and WCL2 are formed to be flat so that the edge portion adjacent to the first bank BNL1 may be parallel to the top surface of the first bank BNL1, or the central portions of the color control structures TPL, WCL1, and WCL2 may be formed to be higher different from the illustrated embodiment.

The light emitting element ED of each sub-pixel SPXn may emit the blue light of the same third color, and the sub-pixels SPXn may emit different color light. For example, the light emitted from the light emitting element ED disposed in the first sub-pixel SPX1 is incident on the first wavelength conversion layer WCL1, the light emitted from the light emitting element ED disposed in the second sub-pixel SPX2 is incident on the second wavelength conversion layer WCL2, and the light emitted from the light emitting element ED disposed in the third sub-pixel SPX3 is incident on the light transmitting layer TPL. The light incident on the first wavelength conversion layer WCL1 may be converted into red light, the light incident on the second wavelength conversion layer WCL2 may be converted into green light, and the light incident on the light transmitting layer TPL may be transmitted as the blue light (e.g., the same blue light) without wavelength conversion. Thus, even when each sub-pixel SPXn includes the light emitting elements ED that emit the light of the same color, the lights of different colors may be emitted depending on the arrangement of the color control structures TPL, WCL1, and WCL2 arranged thereabove.

The first capping layer CPL1 may be disposed on the plurality of color control structures TPL, WCL1 and WCL2 and the first bank BNL1. The first capping layer CPL1 may prevent impurities, such as moisture or air, from permeating from the outside and damaging or contaminating the color control structures TPL, WCL1, and WCL2. The first capping layer CPL1 may include (or contain) an inorganic insulating material.

The low refractive layer LRL may be disposed on the first capping layer CPL1. The low refractive layer LRL, that is, an optical layer for recycling the light having transmitted the color control structures TPL, WCL1, and WCL2, may improve the light emission efficiency and the color purity of the display device 10. The low refractive layer LRL may include (or may be made of) an organic material having a low refractive index and may compensate for (e.g., may planarize) the stepped portions formed by the color control structures TPL, WCL1, and WCL2 and the first bank BNL1.

The second capping layer CPL2 may be disposed on the low refractive layer LRL and may prevent impurities, such as moisture, air, or the like, from permeating from the outside and damaging or contaminating the low refractive layer LRL. The second capping layer CPL2 may include an inorganic insulating material similar to the first capping layer CPL1.

The planarization layer PNL may be disposed across the entire display area DPA and the entire non-display area NDA on the second capping layer CPL2. The planarization layer PNL may overlap the color control structures TPL, WCL1, and WCL2 in the display area DPA and may also be disposed in the non-display area NDA.

The planarization layer PNL may protect the members disposed on the first substrate SUB in addition to the plurality of capping layers CPL1 and CPL2 and the low refractive layer LRL and may partially compensate for (e.g., may partially planarize) the stepped portion formed by them. For example, the planarization layer PNL may compensate for the stepped portion formed by the color control structures TPL, WCL1 and WCL2 disposed thereunder and the first bank BNL1 in the display area DPA so that the light blocking members BM and the color filter layers CFL1, CFL2, and CFL3 disposed thereon may be formed on a flat surface.

The light blocking member BM may be disposed on the planarization layer PNL. The light blocking member BM may be formed in a grid pattern to partially expose one surface of the planarization layer PNL. In the display device 10, the light blocking member BM may be disposed to cover the sub-regions SA of the sub-pixels SPXn in addition to the lower bank layers LBN and the first bank BNL1 in a plan view. The areas in which the light blocking member BM is not disposed may be the light transmitting areas TA1, TA2, and TA3 in which the color filter layers CFL1, CFL2, and CFL3 are disposed to emit light, and the area in which the light blocking member BM is disposed may be the light blocking area BA in which the emission of the light is blocked (or substantially blocked).

The light blocking member BM may include an organic material for (e.g., configured to) absorbing light. The light blocking member BM may reduce color distortion due to external light reflection by absorbing the external light. For example, the light blocking member BM may include (or may be made of) a material used for a black matrix of the display device 10 and may absorb all (or substantially all) wavelengths of visible light.

In some embodiments, the display device 10 may omit the light blocking member BM, and it may be replaced with a material that absorbs light of a specific wavelength from among visible light wavelengths and transmits light of another specific wavelength. For example, the light blocking member BM may be replaced with a color pattern including (or containing) the same material as at least one of the color filter layers CFL1, CFL2, and CFL3. For example, the color pattern including (or containing) the material of any one of the color filter layers or a structure in which a plurality of color patterns are stacked may be disposed in the region where the light blocking member BM is disposed.

The plurality of color filter layers CFL1, CFL2, and CFL3 may be disposed on one surface of the planarization layer PNL. The plurality of color filter layers CFL1, CFL2, and CFL3 may be disposed on the planarization layer PNL to correspond to the regions exposed by the light blocking member BM. The different color filter layers CFL1, CFL2, and CFL3 may be spaced apart from each other with the light blocking member BM interposed between, but the present disclosure is not limited thereto. In some embodiments, some of the color filter layers CFL1, CFL2, and CFL3 may be arranged on the light blocking member BM and separated from each other on the light blocking member BM. In another embodiment, the color filter layers CFL1, CFL2, and CFL3 may partially overlap each other.

The color filter layers CFL1, CFL2, and CFL3 may include a first color filter layer CFL1 disposed in the first sub-pixel SPX1, a second color filter layer CFL2 disposed in the second sub-pixel SPX2, and a third color filter layer CFL3 disposed in the third sub-pixel SPX3. The color filter layers CFL1, CFL2, and CFL3 may be formed in a linear pattern disposed on the plurality of light transmitting areas TA1, TA2, and TA3 or the plurality of emission areas EMA. However, the present disclosure is not limited thereto. The color filter layers CFL1, CFL2, and CFL3 may be disposed to correspond to the light transmitting areas TA1, TA2, and TA3, respectively, and may form an island-shaped pattern.

The color filter layers CFL1, CFL2, and CFL3 may include (or contain) a colorant, such as a dye and a pigment, that absorb light of a wavelength band other than a specific wavelength band. The color filter layers CFL1, CFL2, and CFL3 may be arranged for each sub-pixel SPXn and may transmit only some of the light incident on the color filter layers CFL1, CFL2, and CFL3 in the corresponding sub-pixel SPXn. Each sub-pixel SPXn of the display device 10 may selectively display only the light that has passed through the color filter layers CFL1, CFL2, and CFL3. In an embodiment, the first color filter layer CFL1 may be a red color filter layer, the second color filter layer CFL2 may be a green color filter layer, and the third color filter layer CFL3 may be a blue color filter layer. The light emitted from the light emitting element ED may be emitted through the color filter layers CFL1, CFL2, and CFL3 after transmitting (e.g., after transmitting or passing through) the color control structures TPL, WCL1, and WCL2.

The overcoat layer OC may be disposed on the color filter layers CFL1, CFL2, and CFL3 and the light blocking member BM. The overcoat layer OC may be disposed in the entire display area DPA and may be partially disposed in the non-display area NDA. The overcoat layer OC may protect the members including (or containing) an organic insulating material and arranged in the display area DPA from the outside.

In the display device 10 according to one embodiment, the display substrate 100 includes the color control structures TPL, WCL1, and WCL2 and the color filter layers CFL1, CFL2, and CFL3 disposed on the light emitting elements ED so that different color light may be displayed even when the same type of light emitting elements ED are disposed in each sub-pixel SPXn.

For example, the light emitting element ED disposed in the first sub-pixel SPX1 may emit the blue light of the third color, and the light may be incident on the first wavelength conversion layer WCL1 while transmitting the fourth insulating layer PAS4. The first base resin BRS1 of the first wavelength conversion layer WCL1 may include (or may be made of) a transparent material, and some of the light may transmit the first base resin BRS1 and be incident on the first capping layer CPL1 disposed thereon. However, at least some of the light may be incident on the scatterer SCP and the first wavelength conversion material WCP1 arranged in the first base resin BRS1. The light may be scattered and subjected to wavelength conversion and may then be incident as red light on the first capping layer CPL1. The light incident on the first capping layer CPL1 may be incident on the first color filter layer CFL1 while transmitting the low refractive layer LRL, the second capping layer CPL2, and the planarization layer PNL, and the transmission of other light (e.g., of other color light) except the red light may be blocked by the first color filter layer CFL1. Accordingly, the first sub-pixel SPX1 may emit the red light.

Similarly, the light emitted from the light emitting element ED disposed in the second sub-pixel SPX2 may be emitted as the green light while transmitting the fourth insulating layer PAS4, the second wavelength conversion layer WCL2, the first capping layer CPL1, the low refractive layer LRL, the second capping layer CPL2, the planarization layer PNL, and the second color filter layer CFL2.

The light emitting element ED disposed in the third sub-pixel SPX3 may emit the blue light of the third color, and the blue light may be incident on the light transmitting layer while transmitting the fourth insulating layer PAS4. The third base resin BRS3 of the light transmitting layer TPL may include (or may be made of) a transparent material, and some of the light may transmit the third base resin BRS3 and be incident on the capping layer CPL1 disposed thereon. The light incident on the first capping layer CPL1 may be incident on the third color filter layer CFL3 while transmitting the low refractive layer LRL, the second capping layer CPL2, and the planarization layer PNL, and the transmission of other light except the blue light may be blocked by the third color filter layer CFL3. Accordingly, the third sub-pixel SPX3 may emit the blue light.

Figure 16:
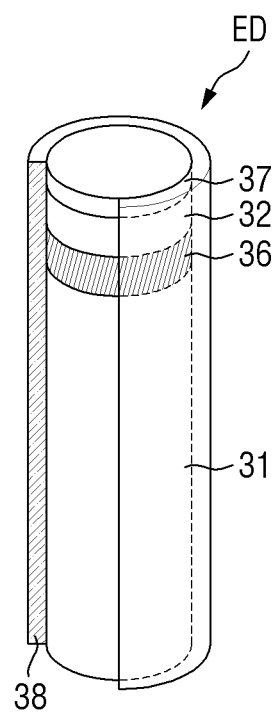
FIG. 16 is a schematic view of a light emitting element according to one embodiment.

FIG. 16 is a schematic view of a light emitting element according to one embodiment.

Referring to FIG. 16, the light emitting element ED may be a light emitting diode. The light emitting element ED may be an inorganic light emitting diode that has a nanometer or micrometer size and includes (or is made of) an inorganic material. The light emitting element ED may be aligned between two electrodes that face each other and have polarity when an electric field is formed in a specific direction between the two electrodes.

The light emitting element ED according to one embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape, such as a regular cube, a rectangular parallelepiped, and a hexagonal prism, or may have various shapes, such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although an embodiment in which the first semiconductor layer 31 and the second semiconductor layer 32 are configured as one layer is illustrated, the present disclosure is not limited thereto. Depending on the material of the light emitting layer 36, the first semiconductor layer 31 and the second semiconductor layer 32 may further include a greater number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be alternately stacked. The light emitting layer 36 may emit light by the coupling of electron-hole pairs according to an electrical signal applied through the first semiconductor layer 31 and the second semiconductor layer 32. The light emitting layer 36 may include a material such as AlGaN or AlGaInN. For example, when the light emitting layer 36 has a structure in which quantum layers and well layers are alternately stacked in a multiple quantum well structure, the quantum layer may include a material, such as AlGaN or AlGaInN, and the well layer may include a material, such as GaN or AlInN.

The light emitting layer 36 may have a structure in which semiconductor materials having large band gap energy and semiconductor materials having small band gap energy are alternately stacked and may include other group III to V semiconductor materials according to the wavelength band of the emitted light. The light emitted by the light emitting layer 36 is not limited to light of a blue wavelength band, but the light emitting layer 36 may also emit light of a red or green wavelength band in some embodiments.

The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto. In some embodiments, the electrode layer 37 may be omitted.

When the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to surround the outer surfaces of the plurality of semiconductor layers and electrode layers described above. For example, the insulating film 38 may be disposed to surround at least the outer surface of the light emitting layer 36 and may be formed to expose both ends of the light emitting element ED in the longitudinal direction. Further, in a cross-sectional view, the insulating film 38 may have a top surface, which is rounded in a region adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), and aluminum oxide ($AlO_x$). While the insulating film 38 is shown as a single layer in the drawings, the present disclosure is not limited thereto. In some embodiments, the insulating film 38 may have a multilayer structure including a plurality of stacked layers.

The insulating film 38 may protect the semiconductor layers and the electrode layer of the light emitting element ED. The insulating film 38 may prevent an electrical short circuit that may occur at the light emitting layer 36 when an electrode to which an electrical signal is transmitted directly contacts the light emitting element ED. In addition, the insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. In some embodiments, the surface of the insulating film 38 may be treated in a hydrophobic or hydrophilic manner (e.g., may have a hydrophobic or hydrophilic surface treatment) to maintain the light emitting elements ED in a dispersed state without aggregation with other light emitting elements ED in the ink.

Hereinafter, other embodiments of the display device 10 will be described with reference to other drawings.

Figure 17:
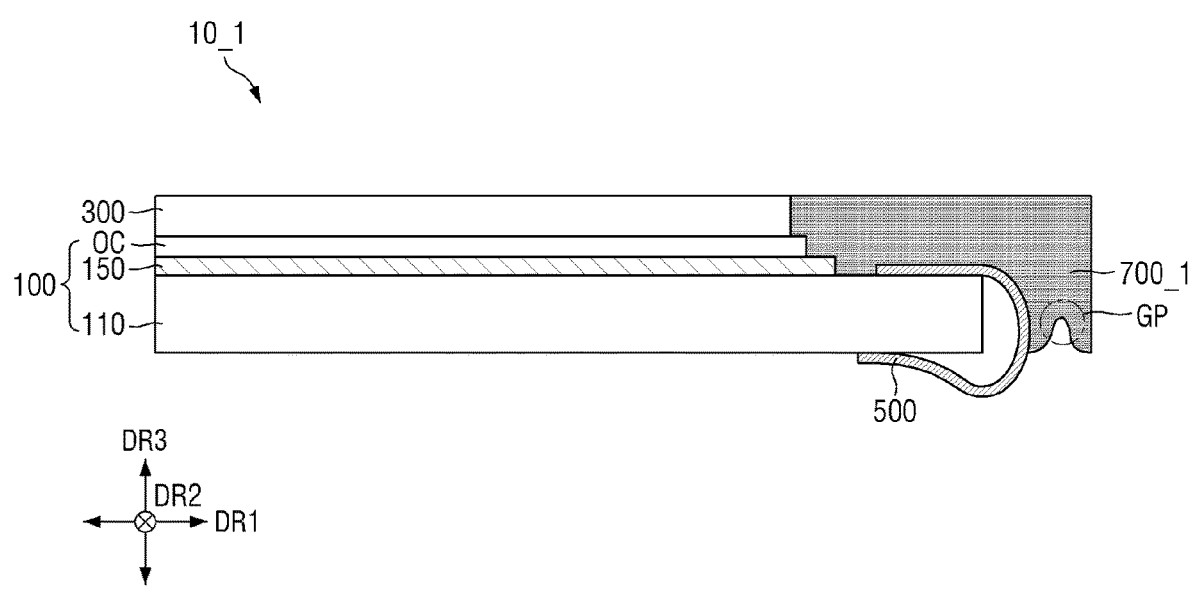
FIG. 17 is a cross-sectional view of a display device according to another embodiment.
Figure 18:
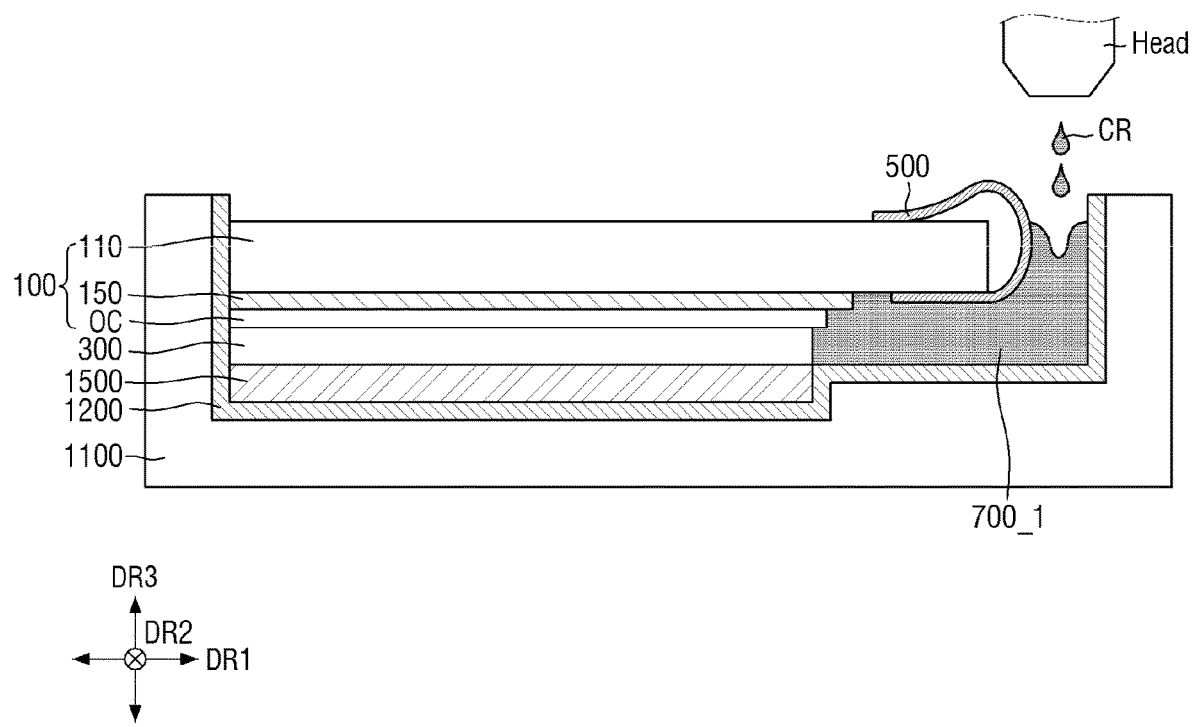
FIG. 18 is a cross-sectional view illustrating one step in a manufacturing process of the display device shown in FIG. 17.

FIG. 17 is a cross-sectional view of a display device according to another embodiment, and FIG. 18 is a cross-sectional view illustrating one step in a manufacturing process of the display device of FIG. 17.

Referring to FIGS. 17 and 18, in a display device 10_1 according to one embodiment, a first sealing material 700_1 may include a recessed portion GP. The embodiment shown in FIGS. 17 and 18 is different from the embodiment shown in FIG. 5 in that a part of the first sealing material 700_1 has a different structure. In the following description, redundant description may be omitted and differences between these embodiments will be explained.

In the display device 10_1, the display substrate 100 on which the optical layer 300 and the circuit board 500 are disposed is disposed in the upside-down state in the mold 1000 and, then, the first sealing material 700_1 may be formed by a process of injecting the first resin composition CR into the space between the main body 1100 of the mold 1000 and the display device 10. Because the first sealing material 700_1 is a fluid, the interface shape of the first resin composition CR having fluidity may vary depending on the material of the release paper 1300. For example, when the attractive force between the first resin composition CR and the release paper 1300 or the adhesive force of the first resin composition CR to the release paper 1300 is greater than the cohesive force of the first resin composition CR, the first resin composition CR may move along the surface of the release paper 1300 due to a capillary phenomenon. As shown in FIG. 18, the height of the first resin composition CR positioned between the circuit board 500 and the release paper 1300 disposed on the sidewall of the main body 1100 may be higher at the portion at an area in contact with the surface of the release paper 1300 than at the central portion.

Accordingly, the display device 10_1 according to one embodiment may include the recessed portion GP formed on the bottom surface of the portion of the first sealing material 700_1 that covers the third portion P3 of the circuit board 500. The first sealing material 700_1 may be disposed to cover the third portion P3 of the circuit board 500 while compensating for the stepped portion formed by the circuit boards 500 disposed thereunder, and thus, the first sealing material 700_1 may have different thicknesses (H2, H3, and H4 in FIG. 5) depending on positions. In addition, the first sealing material 700_1 may include the recessed portion GP in which the surface is partially recessed due to the capillary phenomenon that may occur during the manufacturing process depending on the type of the material thereof. A portion of the first sealing material 700_1 that covers the third portion P3 of the circuit board 500 may have the recessed portion GP in which the bottom surface is partially recessed, and the portion where the recessed portion GP is formed may have a smaller thickness than the peripheral portion.

However, the present disclosure is not limited thereto. The recessed portion GP of the first sealing material 700_1 may not necessarily have a shape in which the bottom surface of the first sealing material 700_1 is recessed.

Figure 19:
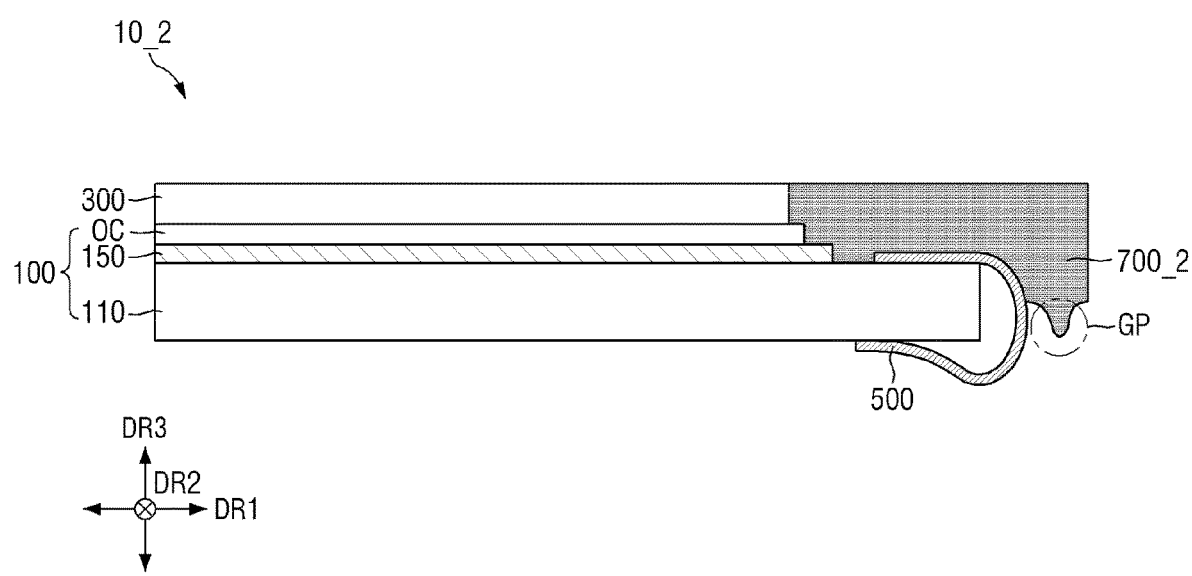
FIG. 19 is a cross-sectional view of a display device according to another embodiment.
Figure 20:
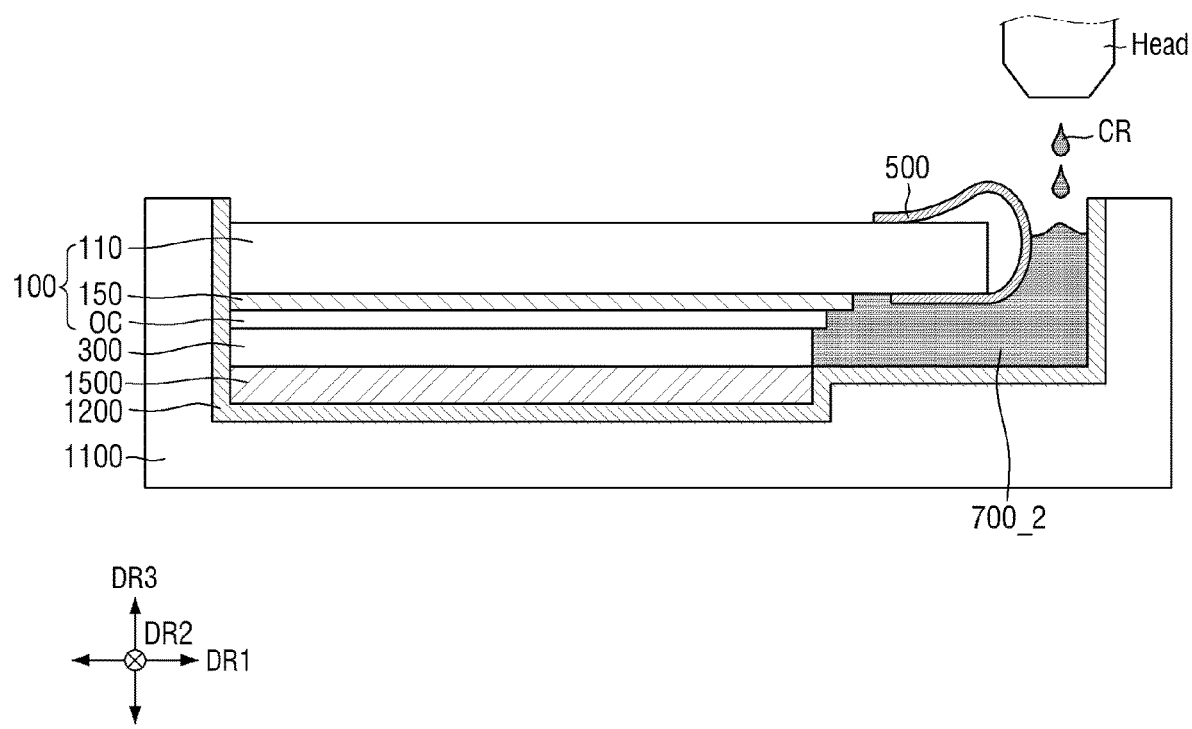
FIG. 20 is a cross-sectional view illustrating one step in a manufacturing process of the display device shown in FIG. 19.

FIG. 19 is a cross-sectional view of a display device according to another embodiment, and FIG. 20 is a cross-sectional view illustrating one step in a manufacturing process of the display device of FIG. 19.

Referring to FIGS. 19 and 20, in a display device 10_2 according to one embodiment, a first sealing material 700_2 may include a protruding portion GP. The embodiment shown in FIGS. 19 and 20 is different from the embodiment shown in FIG. 17 in that it further includes the protruding portion GP in which the bottom surface of the portion of the first sealing material 700_2 that covers the third portion P3 of the circuit board 500 partially protrudes.

As described above, the first resin composition CR may move along the surface of the release paper 1300 due to the capillary phenomenon. Different from the embodiment shown in FIGS. 17 and 18, when the cohesive force of the first resin composition CR is greater than the adhesive force with the release paper 1300, the height of the first resin composition CR positioned between the circuit board 500 and the release paper 1300 disposed on the sidewall of the main body 1100 may be lower at the portion in contact with the surface of the release paper 1300 than at the central portion.

Accordingly, the display device 10_2 according to one embodiment may include the protruding portion GP formed on the bottom surface of the portion of the first sealing material 700_2 that covers the third portion P3 of the circuit board 500. The portion of the first sealing material 700_2 that covers the third portion P3 of the circuit board 500 may have the protruding portion GP in which the bottom surface partially protrudes, and the portion where the protruding portion GP is formed may have a larger thickness than the peripheral portion.

In the display device 10, the first sealing material 700 and the circuit board 500 disposed thereunder may be visually recognized from the outside depending on the material of the first sealing material 700. The display device 10 according to one embodiment may further include other layers or members disposed on the first sealing material 700 to prevent an area other than the display area DPA from being visually recognized from the outside.

Figure 21:
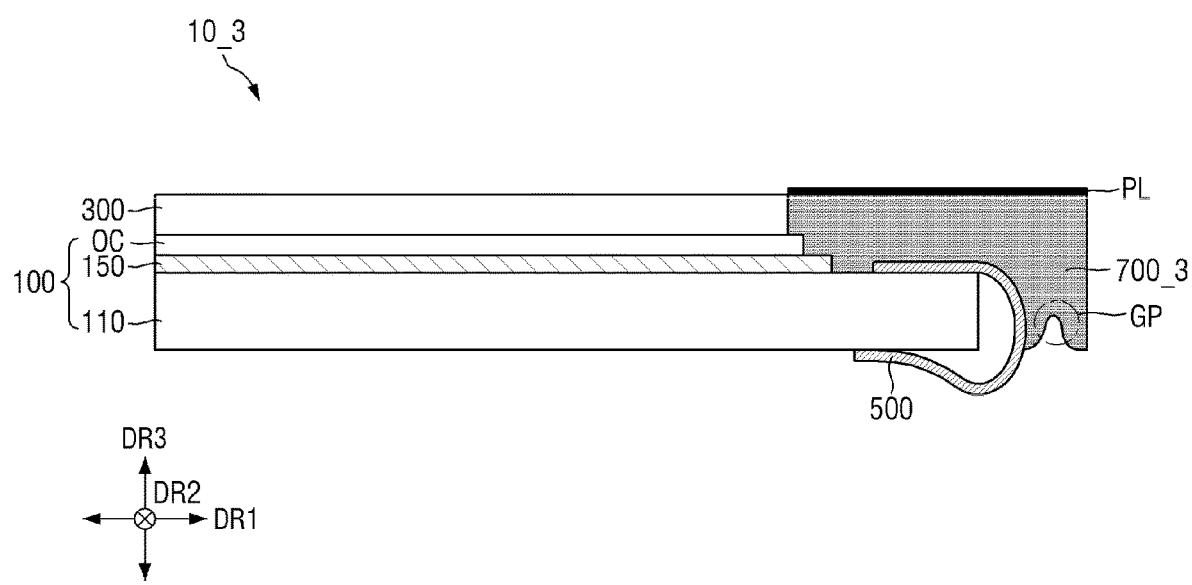
FIGS. 21 and 22 are cross-sectional views of a display device according to other embodiments.
Figure 22:
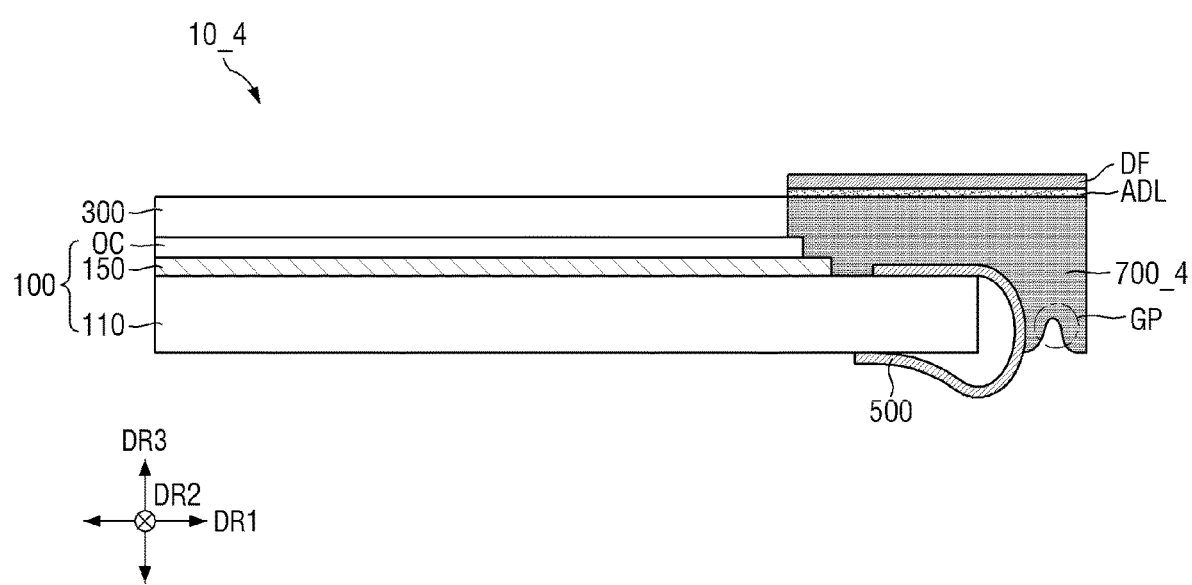

FIGS. 21 and 22 are cross-sectional views of a display device according to other embodiments.

Referring to FIG. 21, a display device 10_3 according to one embodiment may further include a print layer PL disposed on a first sealing material 700_3. The display device 10_3 may further include the print layer PL to prevent the first sealing material 700_3 disposed in the pad area PDA in the non-display area NDA and the circuit boards 500 disposed thereunder from being visually recognized from the outside. The embodiment shown in FIG. 21 is different from the embodiment shown in FIG. 17 in that the display device 10_3 further includes the print layer PL.

The print layer PL may be directly disposed on the top surface of the first sealing material 700_3. For example, the print layer PL may be disposed on the top surface of the portion of the first sealing material 700_3 that is disposed on the display substrate 100 and the top surface of the portion that covers the third portions P3 of the circuit boards 500. The print layer PL may be formed by forming the first sealing material 700_3 in the manufacturing process of the display device 10_3 and then printing the material of the print layer PL on the first sealing material 700_3. The print layer PL may include a material that blocks the transmission of light and may prevent an area other than the display area DPA of the display device 10_3 from being visually recognized from the outside.

Referring to FIG. 22, a display device 10_4 according to one embodiment may further include an adhesive layer ADL and a protective film layer DF disposed on a first sealing material 700_4. The embodiment shown in FIG. 22 is different in that the print layer PL disposed on the first sealing material 700_4 is omitted and the protective film layer DF is attached to the first sealing material 700_4 through the adhesive layer ADL. Different from the embodiment shown in FIG. 21, the display device 10_4 may be manufactured by a process of attaching the protective film layer DF including a light blocking material to the first sealing material 700_4 by using the adhesive layer ADL.

Figure 23:
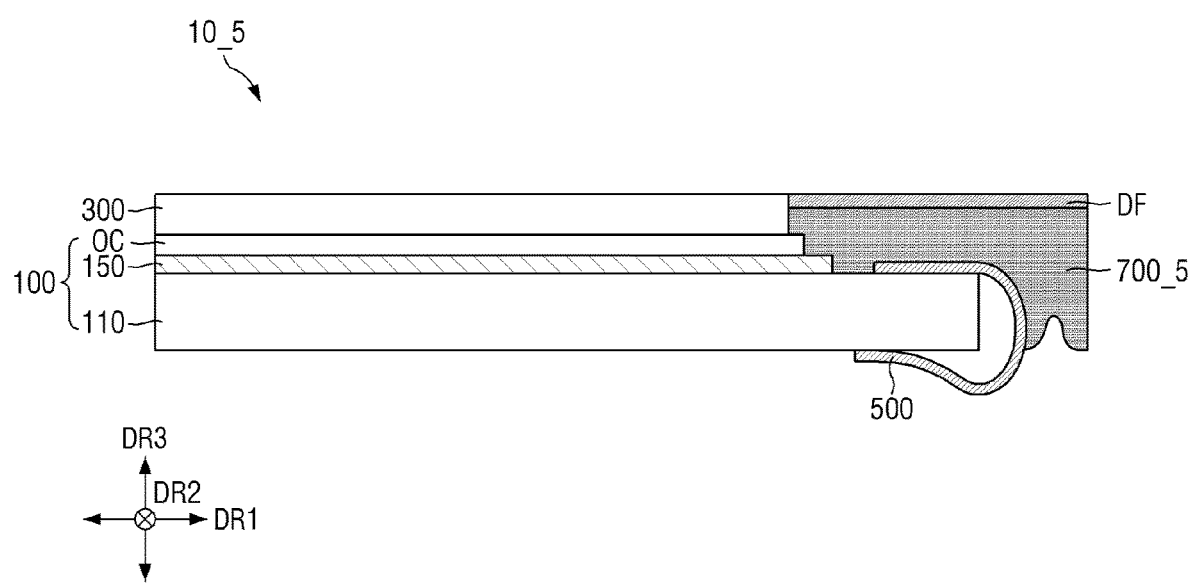
FIG. 23 is a cross-sectional view of a display device according to another embodiment.
Figure 24:
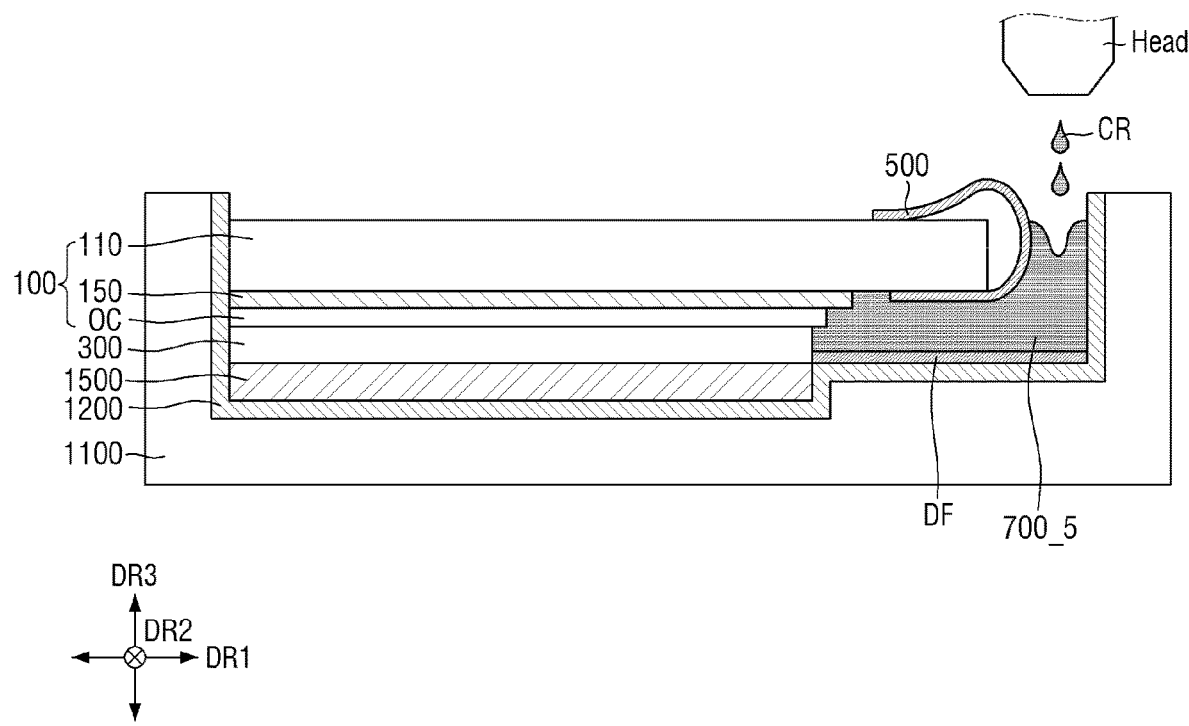
FIG. 24 is a cross-sectional view illustrating one step in a manufacturing process of the display device shown in FIG. 23.

FIG. 23 is a cross-sectional view of a display device according to another embodiment, and FIG. 24 is a cross-sectional view illustrating one step in a manufacturing process of the display device shown in FIG. 23.

Referring to FIGS. 23 and 24, in a display device 10_5 according to one embodiment, the protective film layer DF may be directly disposed on a first sealing material 700_5, and the top surface of the protective film layer DF may be located on the same plane as the top surface of the optical layer 300.

In the embodiments shown in FIGS. 21 and 22, the print layer PL and the protective film layer DF may be disposed after the first sealing material 700_3 or 700_4 are formed and the display device 10_3 or 10_4 is separated from the mold 1000, respectively. Accordingly, the print layer PL and the protective film layer DF may be disposed to protrude on the first sealing materials 700_3 and 700_4, respectively. As described above, the top surfaces of the first sealing materials 700_3 and 700_4 may be located on the same plane as the top surface of the optical layer 300. The top surface of the print layer PL disposed on the first sealing material 700_3 or the top surface of the protective film layer DF disposed on the first sealing material 700_4 may be higher than the top surface of the optical layer 300, and the stepped portion may be formed between the optical layer 300 and the print layer PL or the protective film layer DF.

In the embodiment shown in FIG. 23, the first sealing material 700_5 may be formed after the protective film layer DF is disposed inside the main body 1100 in the manufacturing process of the display device 10_5. Before the first resin composition CR is injected, the protective film layer DF may be disposed on the bottom surface of the main body 1100. The protective film layer DF may be directly disposed on the release paper 1300 at a portion facing the pad area PDA of the display substrate 100, which is a portion of the bottom surface of the main body 1100 on which the passivation layer 1500 is not disposed. When the first resin composition CR is injected into the main body 1100, the first resin composition CR may be positioned between the protective film layer DF and the pad area PDA of the display substrate 100. When the first resin composition CR is cured to form the first sealing material 700_5, each of the protective film layer DF and the display substrate 100 may be adhered to the first sealing material 700_5.

Because the protective film layer DF is formed in addition to the first sealing material 700_5 in the manufacturing process of the display device 10_5, the top surface of the optical layer 300 may be located on the same plane as the top surface of the protective film layer DF, and the stepped portion may not be formed between the optical layer 300 and the protective film layer DF. The display device 10_5 may further include the protective film layer DF to prevent an area other than the display area DPA from being visually recognized from the outside and to prevent the stepped portion between the protective film layer DF and the optical layer 300 from being visually recognized from the outside.

Figure 25:
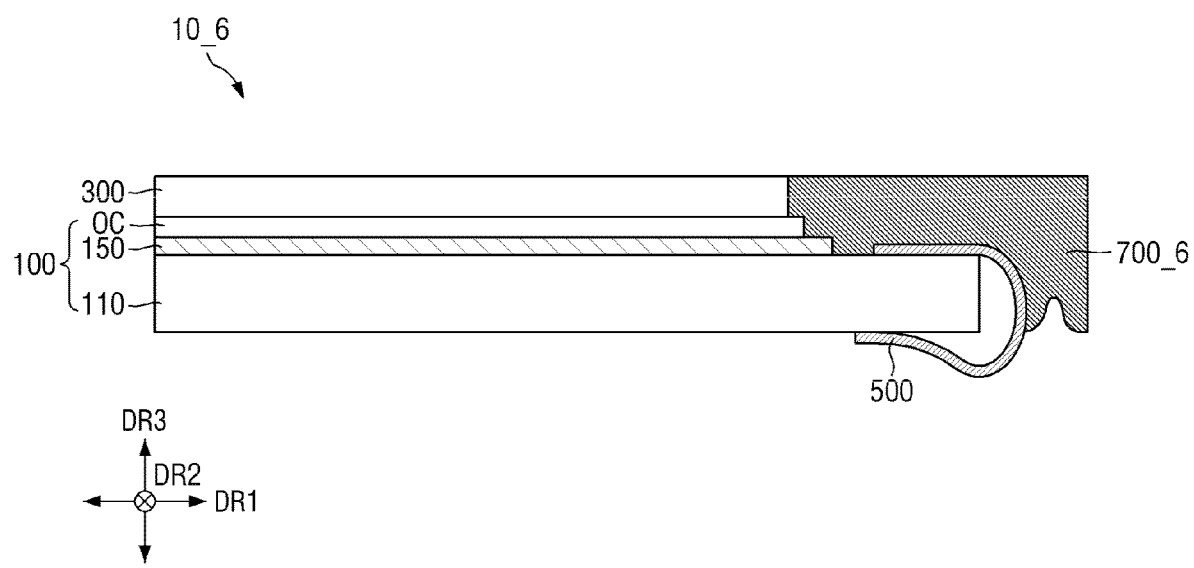
FIG. 25 is a cross-sectional view of a display device according to another embodiment.

FIG. 25 is a cross-sectional view of a display device according to another embodiment.

Referring to FIG. 25, in a display device 10_6 according to one embodiment, a first sealing material 700_6 may further include a light blocking material. The embodiment shown in FIG. 25 is different from the embodiment shown in FIG. 17 in that the material of the first sealing material 700_6 is different.

The display device 10_6 may further include members that prevent an area other than the display area DPA from being visually recognized from the outside. However, the first sealing material 700_6 includes (or is made of) a material that blocks the transmission of light, instead of a transparent material, to prevent the circuit boards 500 from being visually recognized as an area other than the display area DPA from the outside. In the following description, a detailed description of redundant content may be omitted.

Figure 26:
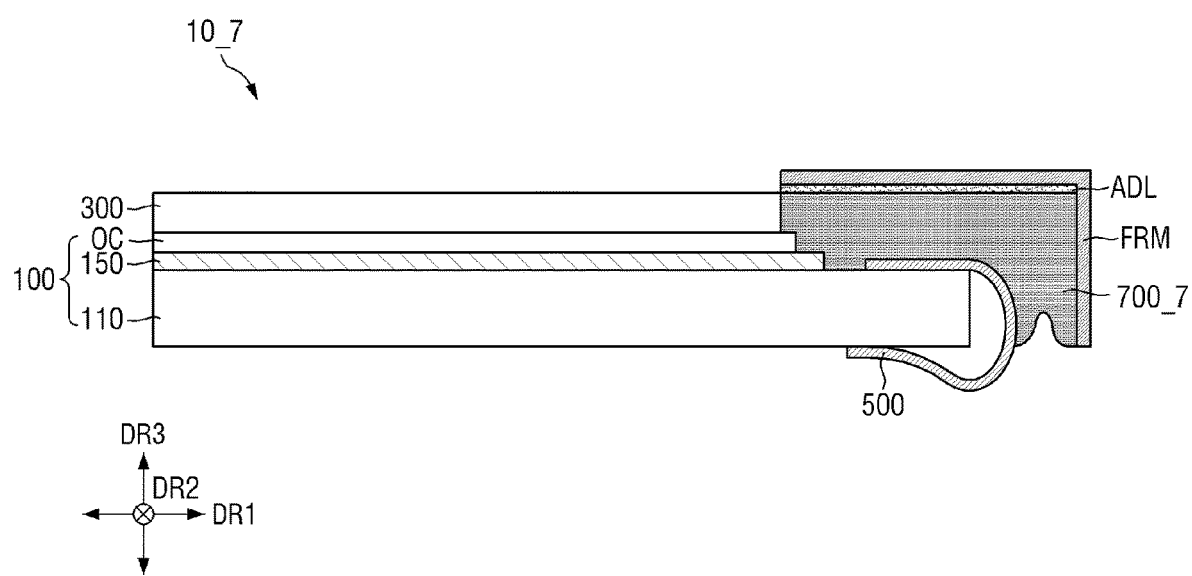
FIG. 26 is a cross-sectional view of a display device according to another embodiment.

FIG. 26 is a cross-sectional view of a display device according to still another embodiment.

Referring to FIG. 26, a display device 10_7 according to one embodiment may further include a frame FRM disposed on a first sealing material 700_7. The frame FRM may be disposed to cover the top surface and the side surface of the first sealing material 700_7. The embodiment shown in FIG. 26 is different from the embodiment shown in FIG. 22 in that the protective film layer DF is replaced with the frame FRM. The frame FRM is attached to the first sealing material 700_7 through the adhesive layer ADL directly disposed on the top surface of the first sealing material 700_7 and may also be disposed on the side surface of the portion of the first sealing materials 700_7 that covers the bent portion of the circuit board 500. The frame FRM may have a structure including portions extending in the second direction DR2 and the third direction DR3 and may completely cover the outer surface of the first sealing material 700_7. The display device 10_7 may further include the frame FRM to prevent the first sealing material 700_7 and the circuit board 500 from being visually recognized from the top surface and the lower side surface.

Figure 27:
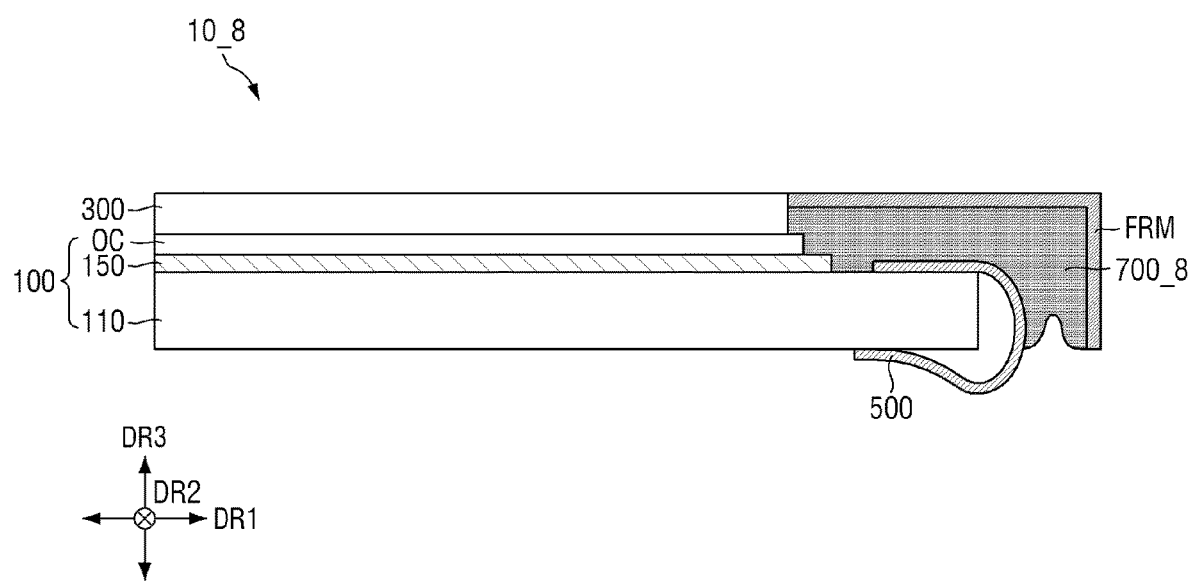
FIG. 27 is a cross-sectional view of a display device according to another embodiment.
Figure 28:
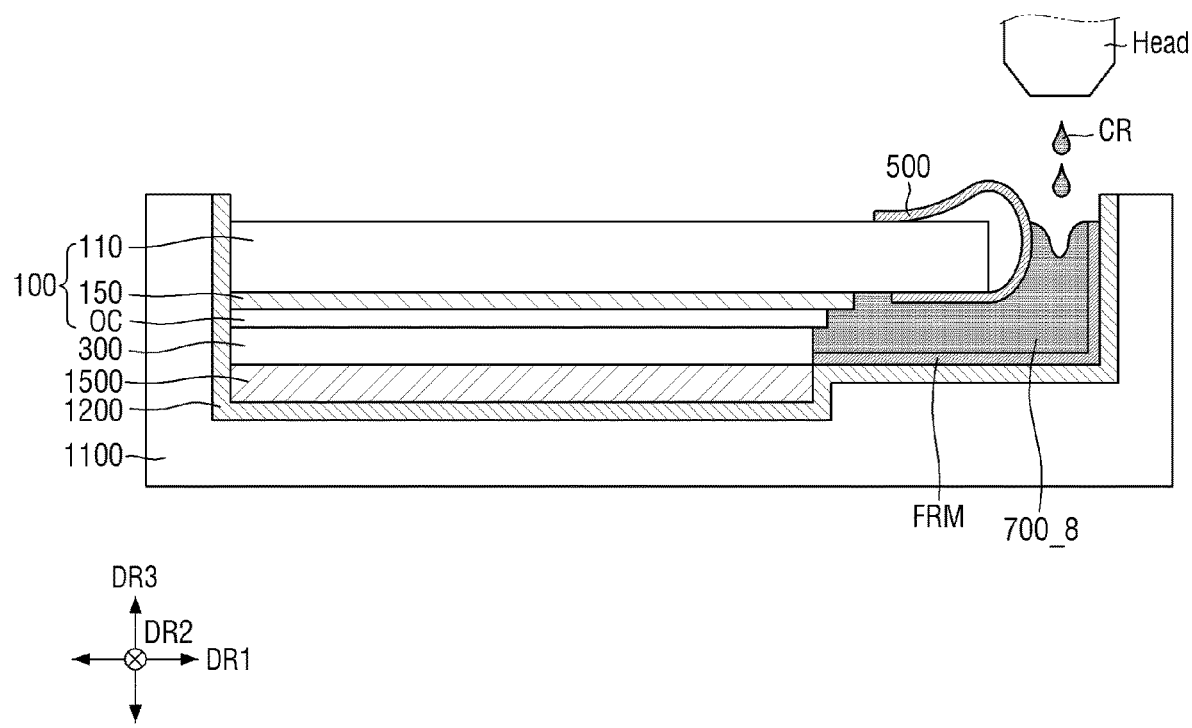
FIG. 28 is a cross-sectional view illustrating one step in a manufacturing process of the display device shown in FIG. 27.

FIG. 27 is a cross-sectional view of a display device according to another embodiment, and FIG. 28 is a cross-sectional view illustrating one step in a manufacturing process of the display device of FIG. 27.

Referring to FIGS. 27 and 28, in a display device 10_8 according to one embodiment, the frame FRM may be directly disposed on a first sealing material 700_8, and the top surface of the frame FRM may be located on the same plane as the top surface of the optical layer 300. The embodiment may be manufactured by a process of disposing the frame FRM in the mold 1000 before the first sealing material 700_8 is formed. Similar to the embodiment shown in FIG. 24, because the first resin composition CR is injected into the mold 1000 in which the frame FRM is disposed, each of the frame FRM and the display substrate 100 may be attached by the first sealing material 700_8. Further, a stepped portion is not formed between the top surface of the frame FRM and the top surface of the optical layer 300 so that the visual recognition of a stepped portion from the outside may be prevented.

Figure 29:
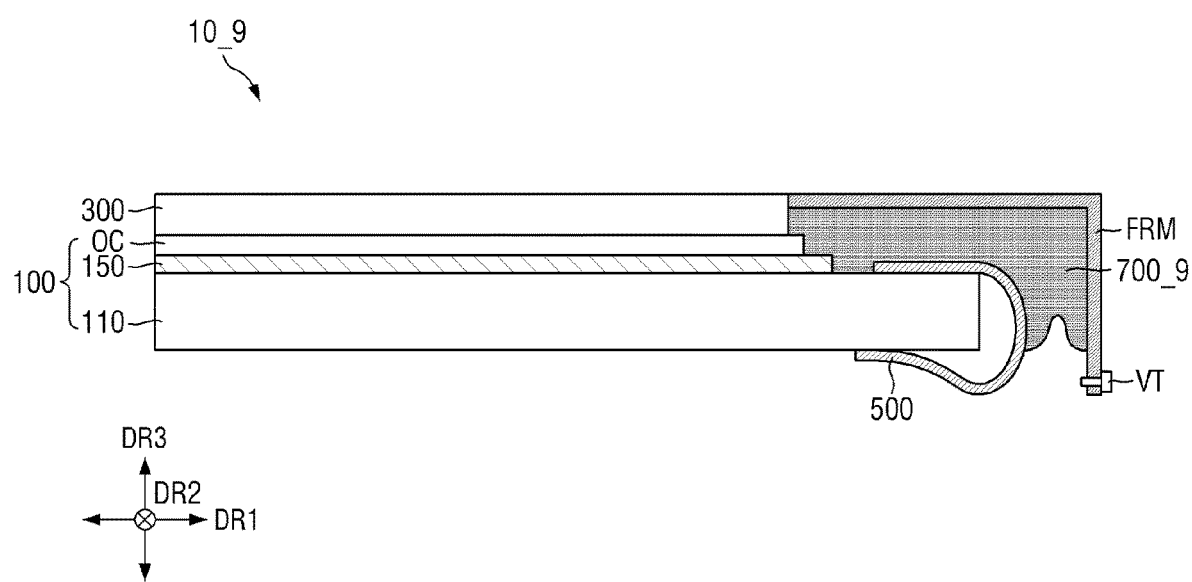
FIG. 29 is a cross-sectional view of a display device according to another embodiment.

FIG. 29 is a cross-sectional view of a display device according to another embodiment.

Referring to FIG. 29, in a display device 10_9 according to one embodiment, the frame FRM may be fixed by a fastening part VT. The frame FRM of the display device 10_9 may be coupled to a separate member surrounding the display substrate 100 by the fastening part VT. The display device 10_9 may include the frame FRM covering the outer surface of the first sealing material 700_9 even when the adhesive layer ADL is omitted and the frame FRM is not disposed in the mold 1000 during the manufacturing process.

Figure 30:
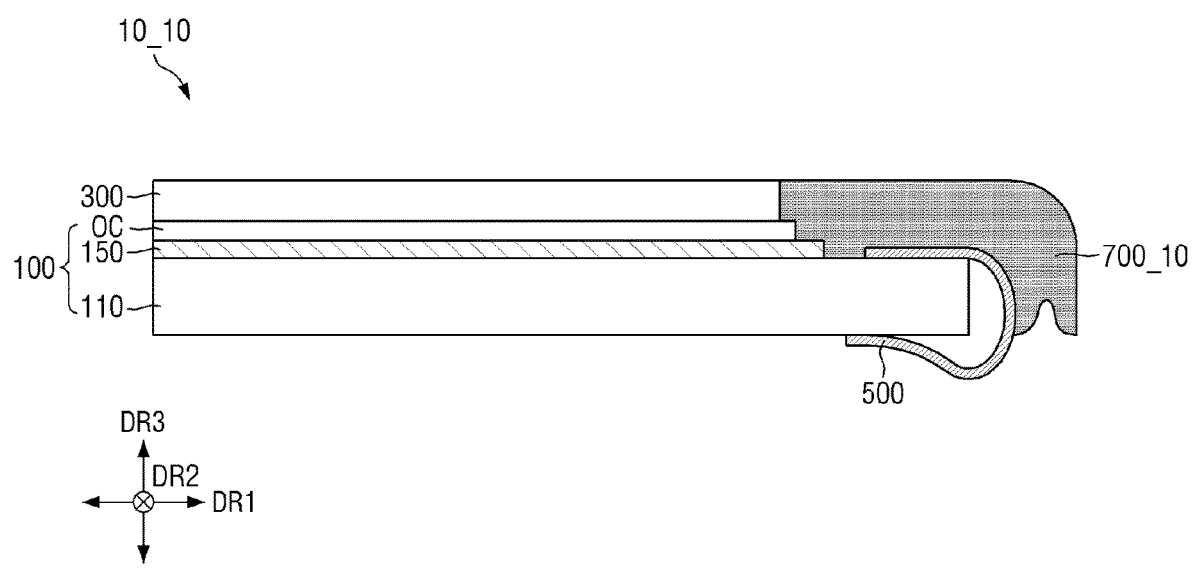
FIGS. 30 and 31 are cross-sectional views of a display device according to another embodiment.
Figure 31:
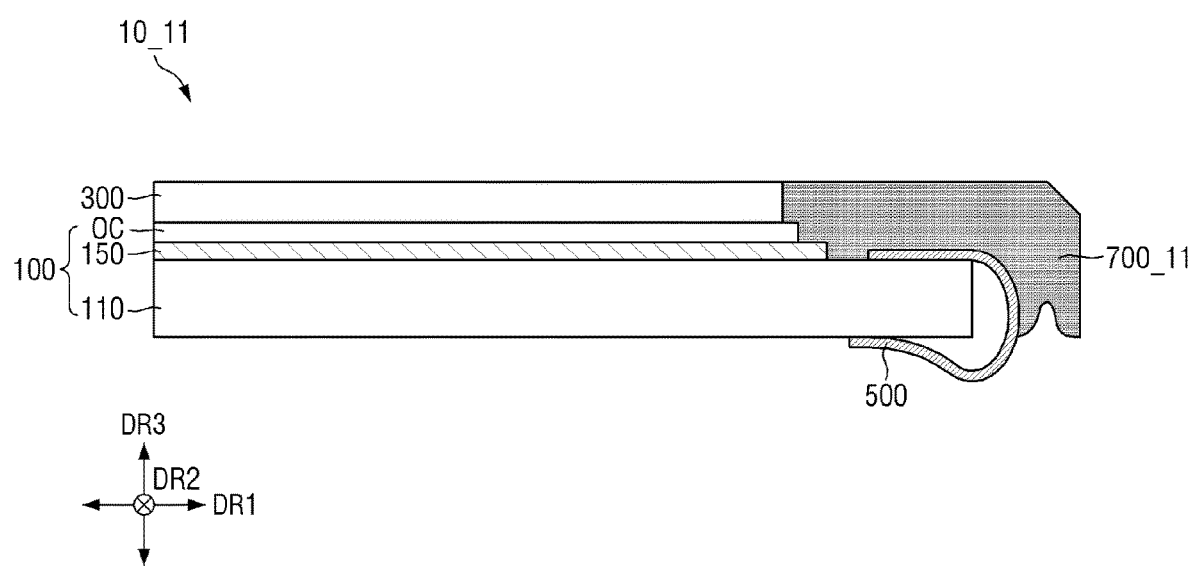

FIGS. 30 and 31 are cross-sectional views of a display device according to still another embodiment.

Referring to FIGS. 30 and 31, in display devices 10_10 and 10_11 according to embodiments, the corner portions of first sealing materials 700_10 and 700_11 may have a rounded shape. In the display device 10_10 shown in FIG. 30, a portion where the top surface of the first sealing material 700_10 and the lateral side covering the bent portion of the circuit board 500, which is one lateral side in the first direction DR1, meet may be formed to be curved. In the display device 10_11 shown in FIG. 31, the portion where the top surface of the first sealing material 700_10 and one lateral side in the first direction DR1 meet may be formed to be inclined in a diagonal direction.

The shapes of the first sealing materials 700_10 and 700_11 of the display devices 10_10 and 10_11 may vary depending on the shapes of products using the display devices 10_10 and 10_11. As illustrated in FIGS. 30 and 31, even when the corner portions of the first sealing materials 700_10 and 700_11 are formed to be inclined or curved, the first sealing materials 700_10 and 700_11 may cover and protect the circuit boards 500.

The display devices 10_10 and 10_11 may be manufactured by forming the right-angled corner portions of the first sealing materials 700_10 and 700_11 and then shaping the corner portions. However, the present disclosure is not limited thereto. As described above, because the first sealing materials 700_10 and 700_11 of the display devices 10_10 and 10_11 are formed by curing the first resin composition CR, the structures of the first sealing materials 700_10 and 700_11 may be changed to correspond to the shape of the mold 1000 into which the first resin composition CR is injected.

Figure 32:
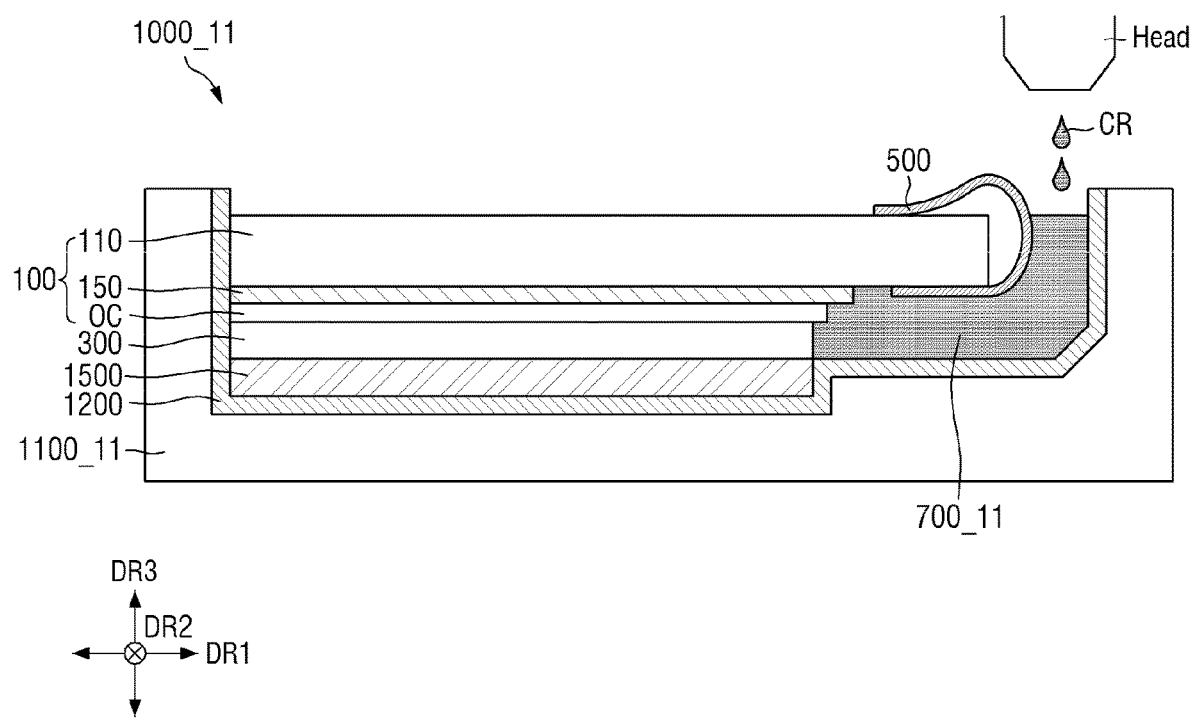
FIG. 32 is a cross-sectional view partially illustrating one step of a manufacturing process of the display device shown in FIG. 31.

FIG. 32 is a cross-sectional view partially illustrating one step of a manufacturing process of the display device shown in FIG. 31.

Referring to FIG. 32, in accordance with one embodiment, in a mold 1000_11 used for manufacturing the display device 10_11, the corner portion where the bottom surface and the sidewall of a main body 1100_11 meet may be formed to be inclined. When the structure of the portion of the bottom surface of the main body 1100_11 into which the first resin composition CR is injected is changed, the shape of the first sealing material 700_11 of the manufactured display device 10_11 may be changed (e.g., may be correspondingly changed). Although an embodiment in which the corner portion at where the bottom surface and the sidewall of the main body 1100_11 meet has an inclined shape is illustrated, the present disclosure is not limited thereto. In the mold 1000_11, the shape of the main body 1100_11 may be changed to correspond to the structure of the first sealing material 700_11 of the display device 10_11.

Figure 33:
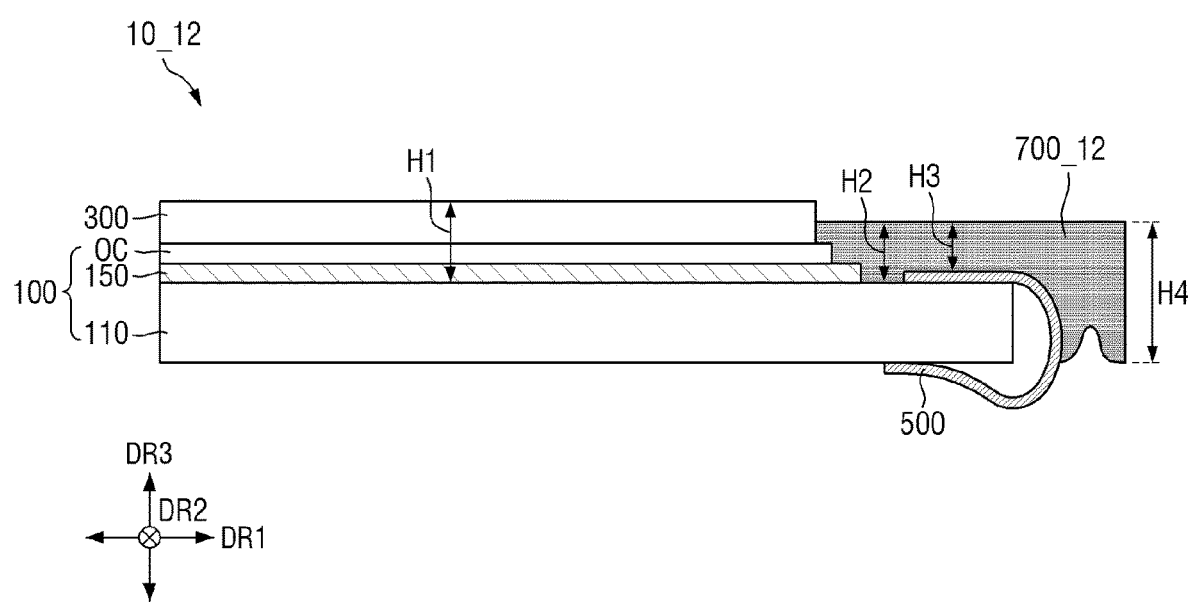
FIG. 33 is a cross-sectional view of a display device according to another embodiment.

FIG. 33 is a cross-sectional view of a display device according to another embodiment.

Referring to FIG. 33, in a display device 10_12 according to one embodiment, the thickness H2 of the portion of the first sealing material 700_12 directly disposed on the display substrate 100 may be smaller than the total thickness H1 of the display layer 150, the overcoat layer OC, and the optical layer 300. The embodiment shown in FIG. 33 is different from the embodiment shown in FIG. 17 in that the thickness of the first sealing material 700_12 is relatively small. The structure of the first sealing material 700_12 may be changed to correspond to the shape of the main body 1100 of the mold 1000. When the first sealing material 700_12 needs to have a smaller thickness as in the embodiment of FIG. 33, the thickness of the first sealing material 700_12 may be adjusted by forming a larger stepped portion on the bottom surface of the main body 1100. In the display device 10_12, the top surface of the first sealing material 700_12 may not be located on the same plane as the top surface of the optical layer 300. However, when other layers are further disposed on the first sealing material 700_12, a stepped portion may not be formed on the front surface of the display device 10_12, and an appearance defect may be prevented.

Figure 34:
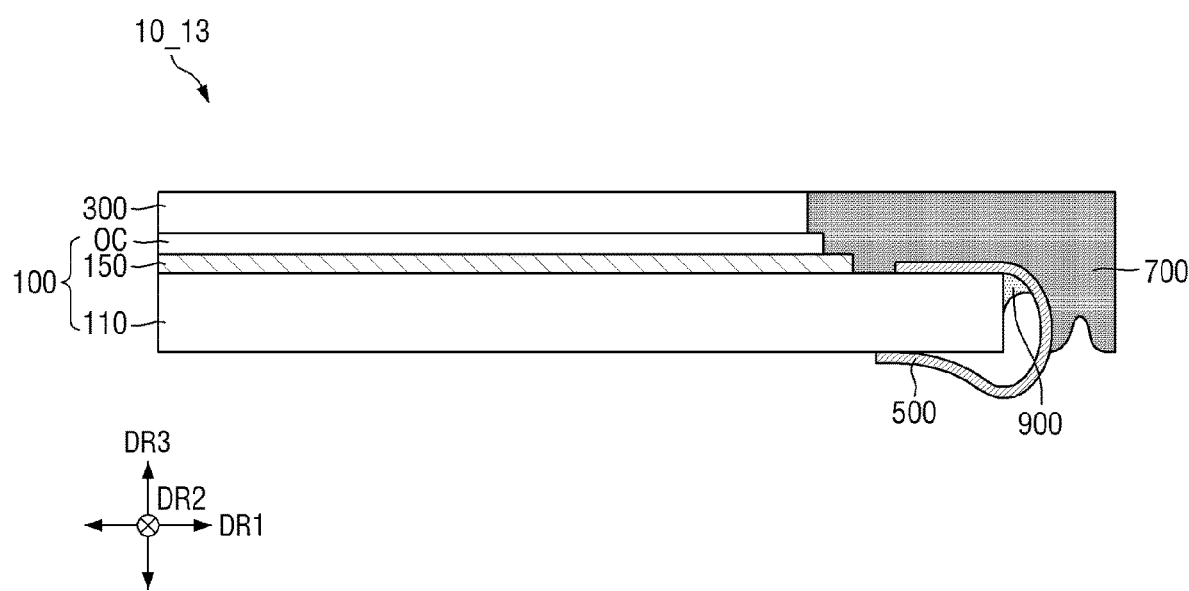
FIG. 34 is a cross-sectional view of a display device according to another embodiment.
Figure 35:
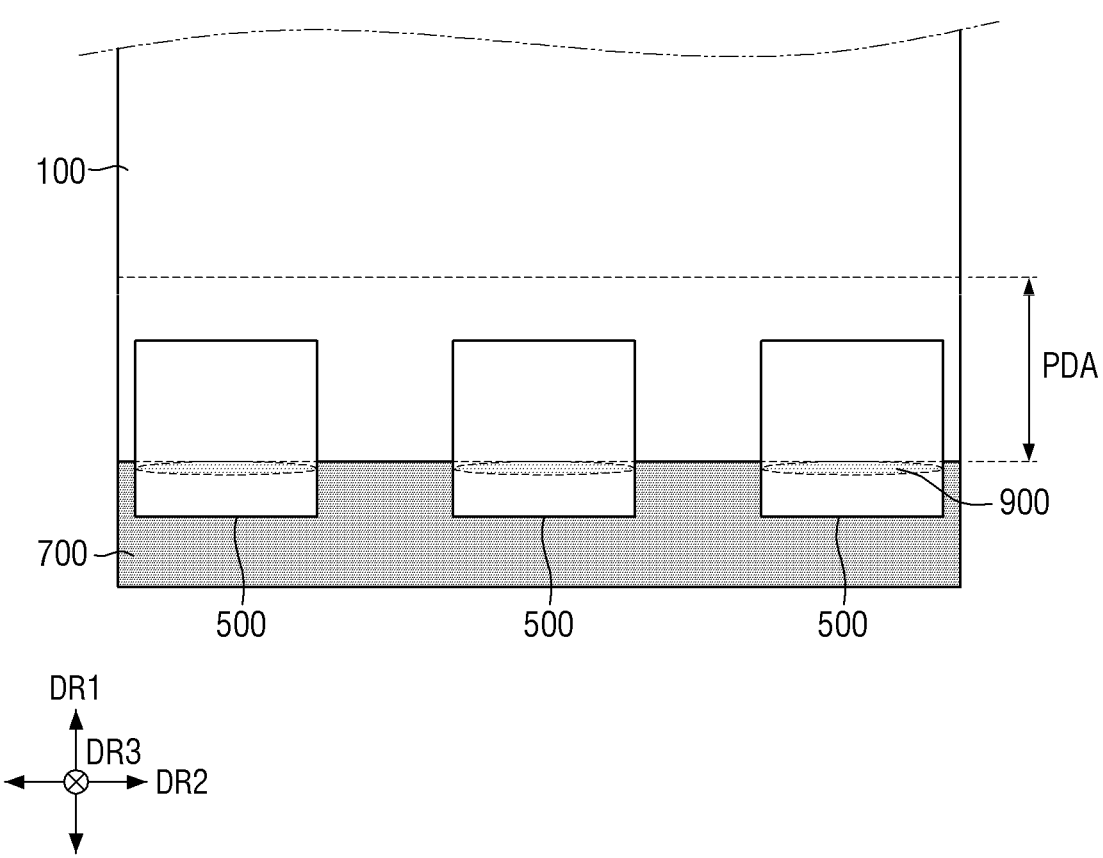
FIG. 35 is a plan view of a part of the display device shown in FIG. 34 viewed from the bottom.

FIG. 34 is a cross-sectional view of a display device according to still another embodiment, and FIG. 35 is a plan view of a part of the display device of FIG. 34 viewed from the bottom.

Referring to FIGS. 34 and 35, a display device 10_13 may include a second sealing material 900 in addition to the first sealing material 700. The first sealing material 700 may be disposed on the circuit board 500, and the second sealing material 900 may be disposed between the circuit board 500 and the display substrate 100. The first sealing material 700 may protect the outer surfaces of the first portion P1 and the third portion P3 of the circuit board 500, and the second sealing material 900 may protect the inner side surface of the circuit board 500.

The second sealing material 900 may be disposed between the lower lateral side of the display substrate 100, which is one side in the first direction DR1, and the bent third portion P3 of the circuit board 500. The second sealing material 900 may be disposed to contact each of the display substrate 100 and the circuit board 500 and may fix the circuit board 500 at the lower lateral side of the display substrate 100.

As described above, because the first sealing material 700 is not disposed between the circuit board 500 and the display substrate 100, the second sealing material 900 and the first sealing material 700 may not be connected to (e.g., may not contact) each other. In the manufacturing process of the display device 10_13, the second sealing material 900 may be formed after the circuit board 500 is attached to the display substrate 100 and before the display device 10 is prepared in the mold 1000. When the display substrate 100 is prepared in the mold 1000 and the first resin composition CR is injected, the first resin composition CR may hardly (or may not) flow to the space between the circuit board 500 and the display substrate 100. Accordingly, in the display device 10_13, the first sealing material 700 and the second sealing material 900 may be spaced apart from each other. In some embodiments, even if the first resin composition CR flows to the space between the circuit board 500 and the display substrate 100, the second sealing material 900 and the first sealing material 700 may not be integrated with each other. In an embodiment in which the first sealing material 700 and the second sealing material 900 contact each other, a physical interface may exist between the first sealing material 700 and the second sealing material 900.

Figure 36:
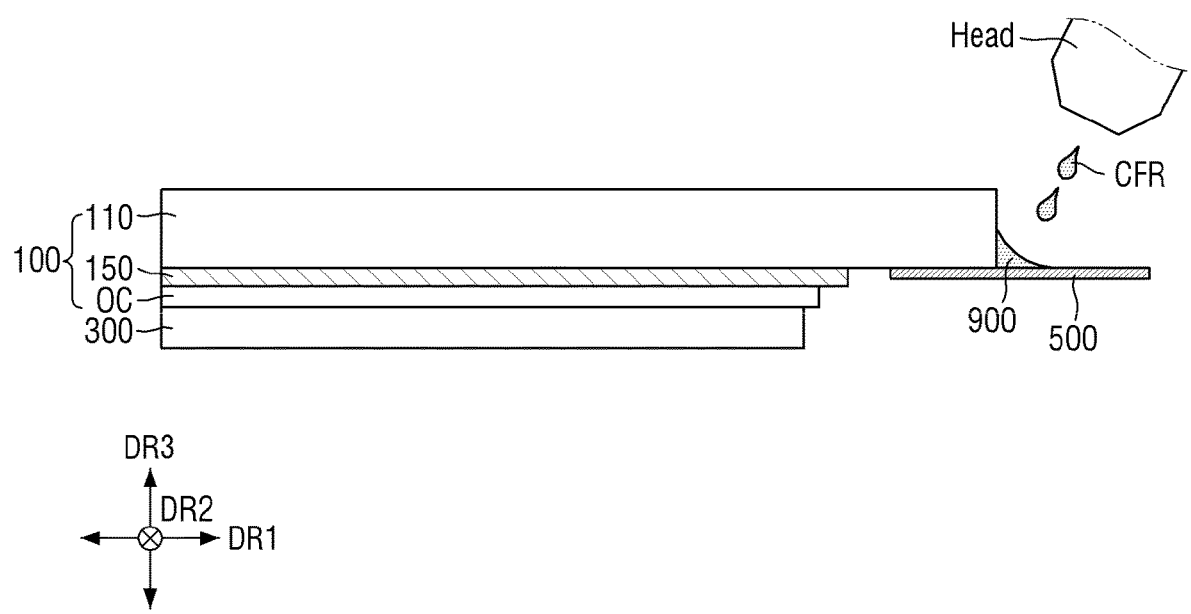
Figure 38:
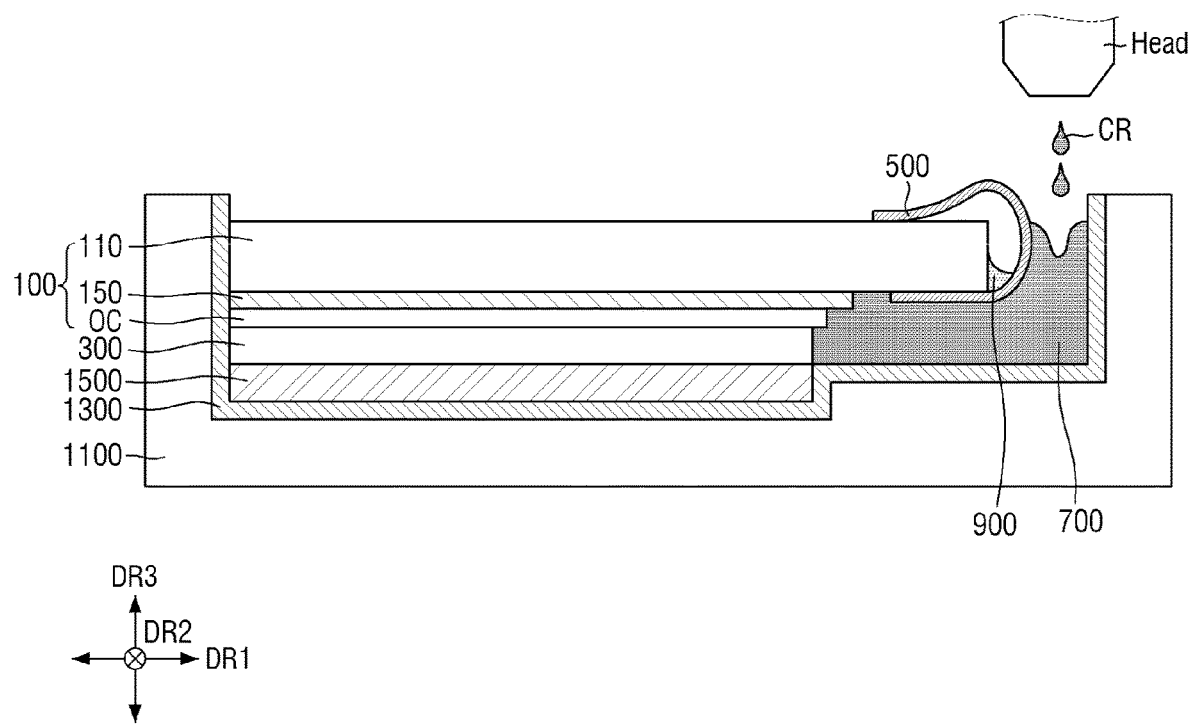

FIGS. 36 to 38 are cross-sectional views illustrating the manufacturing process of the display device shown in FIG. 34.

Referring to FIG. 36, in the manufacturing process of the display device 10_13, the optical layer 300 and the circuit board 500 are disposed on one surface of the display substrate 100 and, then, a second resin composition CFR is injected into the space between one lateral side of the display substrate 100 and the circuit board 500. The second resin composition CFR may be injected into the interface between the display substrate 100 and the circuit board 500 and then cured to form the second sealing material 900 for fixing the display substrate 100 and the circuit board 500. In an embodiment, similar to the first resin composition CR, the second resin composition CFR may include an organic material, such as an epoxy-based resin composition, an acrylic resin composition, and a urethane-based resin composition, or an inorganic material, such as a silicone-based resin composition. In some embodiments, the first resin composition CR and the second resin composition CFR may include different materials, and the first sealing material 700 and the second sealing material 900 may include different materials. However, the present disclosure is not limited thereto, and the first sealing material 700 and the second sealing material 900 may include the same material.

Next, referring to FIGS. 37 and 38, the second resin composition CFR is cured to form the second sealing material 900, and the circuit board 500 is attached to the bottom surface of the display substrate 100. The circuit board 500 may be attached to one surface and the other surface of the display substrate 100 so that the second sealing material 900 may be disposed between the circuit board 500 and the display substrate 100. Next, the display substrate 100 on which the optical layer 300 and the circuit board 500 are disposed is disposed in the main body 1100 of the mold 1000, and the first resin composition CR is injected into the main body 1100. The description of subsequent processes is the same as the above description.

Figure 39:
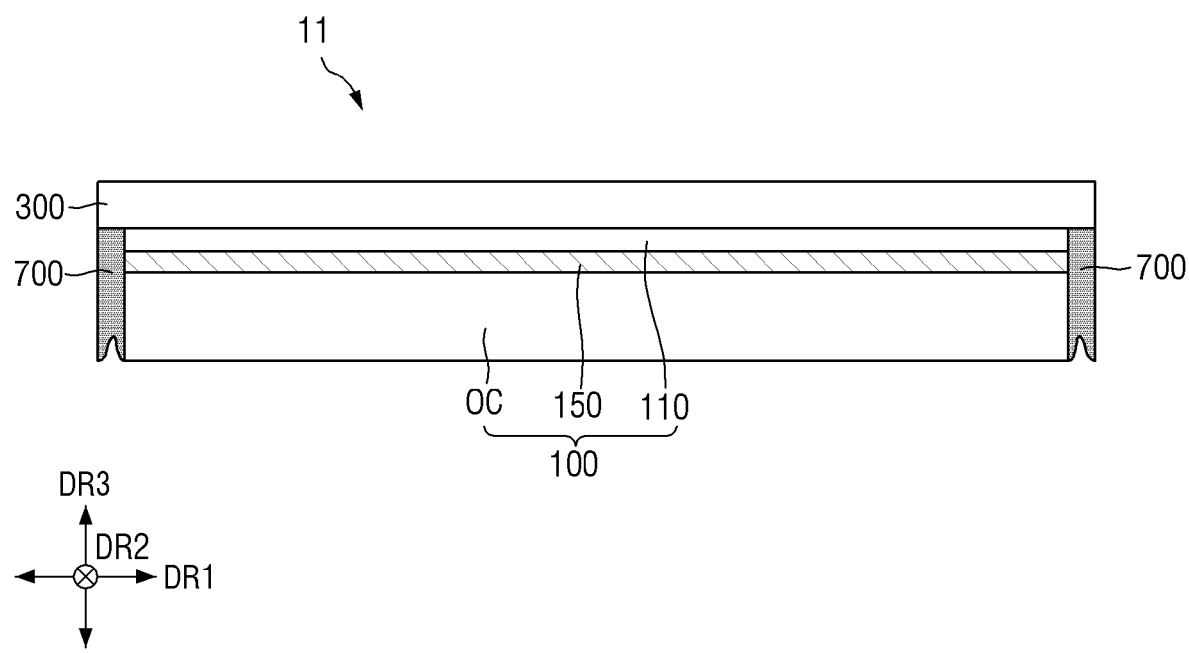
FIG. 39 is a cross-sectional view of a display device according to another embodiment.
Figure 40:
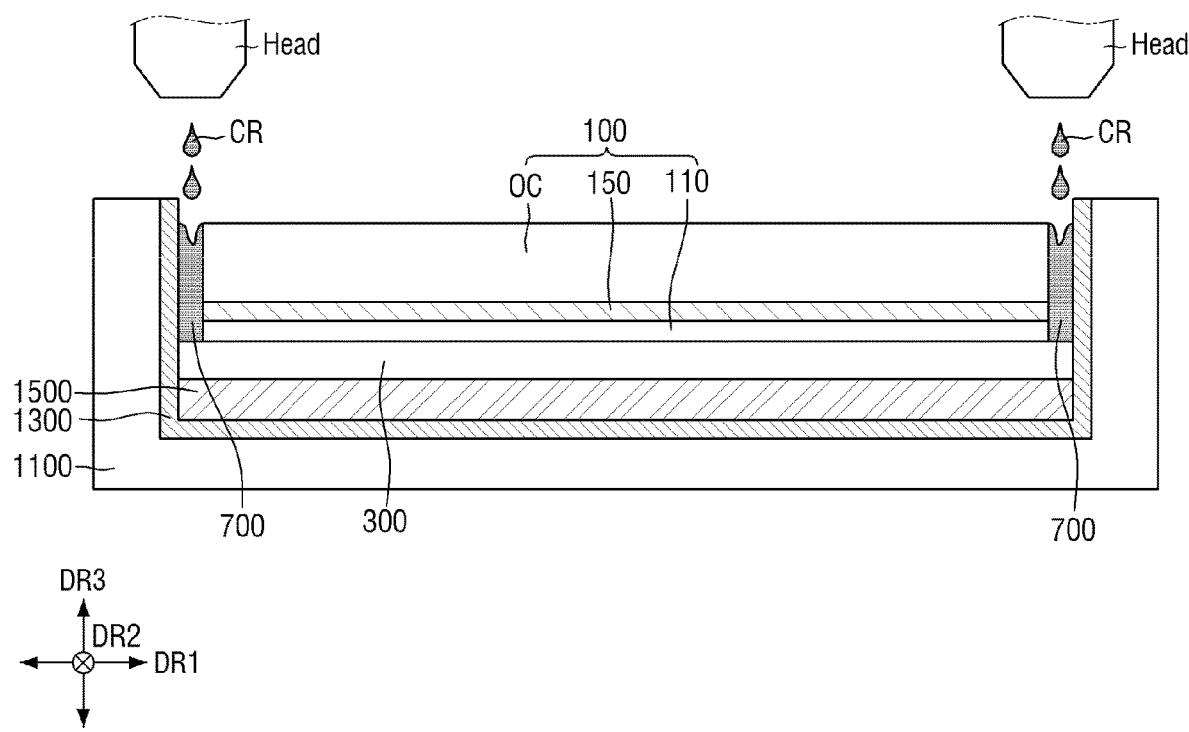
FIG. 40 is a cross-sectional view illustrating one step in a manufacturing process of the display device shown in FIG. 39.

FIG. 39 is a cross-sectional view of a display device according to another embodiment, and FIG. 40 is a cross-sectional view illustrating one step in a manufacturing process of the display device of FIG. 39. FIG. 39 illustrates a cross section across a display device 11 in the second direction DR2.

Referring to FIGS. 39 and 40, in the display device 11 according to one embodiment, the width of the optical layer 300 measured in the second direction DR2 may be greater than the width of the display substrate 100, and the first sealing material 700 may be disposed on both sides of the display substrate 100 in the second direction DR2. The optical layer 300 may be formed to protrude from both sides of the display substrate 100 in the second direction DR2, and the stepped portion between the optical layer 300 and the display substrate 100 may be compensated for by the first sealing material 700. Further, the optical layer 300 may protrude from the opposite side where the pad area PDA is not disposed between both sides of the display substrate 100 in the first direction DR1, and the first sealing material 700 may be disposed below the portion where the optical layer 300 protrudes.

In the above-described embodiments, both side surfaces of the optical layer 300 in the second direction DR2 and one side of the optical layer 300 in the first direction DR1 may be formed in parallel with the lateral sides of the display substrate 100. Accordingly, a stepped portion is not formed between the lateral sides of the optical layer 300 and the lateral sides of the display substrate 100 so that the first sealing material 700 may be omitted. In some embodiments, a stepped portion may be formed between the lateral sides of the optical layer 300 and the lateral sides of the display substrate 100, and the first sealing material 700 covering the circuit boards 500 may also be disposed below the lateral sides of the optical layer 300 protruding from the display substrate 100.

As illustrated in FIG. 40, when the display substrate 100 on which the optical layer 300 is disposed in the upside-down state in the mold 1000, a space may be formed between the lateral sides of the display substrate 100 and the release paper 1300. When the first resin composition CR is injected into the space and cured, the first sealing material 700 surrounding the lateral sides of the display substrate 100 may be formed. In an embodiment, the first sealing material 700 may be disposed between the display substrate 100 and the optical layer 300 to correspond to the size of the optical layer 300.

In concluding the detailed description, those skilled in the art will appreciate that many variations and modifications can be made to the embodiments described herein without substantially departing from the present disclosure. Therefore, the described embodiments are to be used in a generic and descriptive sense and not for purposes of limitation.

What is claimed is:

1. A display device comprising:
    a display substrate having a display area and a pad area at one side of the display area, the display substrate comprising a circuit layer and a display layer on the display area of the circuit layer;
    an optical layer on the display area of a first surface of the display substrate;
    a circuit board on the pad area of the display substrate; and
    a first sealing material on the pad area of the display substrate to cover the circuit board,
    wherein the circuit board has:
        a first portion attached to the first surface of the display substrate,
        a second portion bent downwardly from the first surface and attached to another surface of the display substrate, and
        a third portion bent between the first portion and the second portion,
    wherein the first sealing material covers at least some of an outer surface of the first portion and the third portion,
    wherein the first sealing material exposes an outer surface of the second portion, and
    wherein the first sealing material contacts an area of the display substrate between the display layer and the circuit board.

2. The display device of claim 1, wherein the first sealing material is not between one lateral side of the display substrate and the third portion of the circuit board.

3. The display device of claim 2, further comprising a second sealing material between the one lateral side of the display substrate and the third portion of the circuit board, wherein the second sealing material contacts each of the one lateral side of the display substrate and an inner side surface of the circuit board.

4. The display device of claim 3, wherein the first sealing material and the second sealing material are separated from each other.

5. The display device of claim 1, wherein the first sealing material has a top surface and a side surface of a portion covering the third portion, and
    wherein the top surface and the side surface of the first sealing material are flat surfaces.

6. The display device of claim 5, wherein in the first sealing material, a thickness of a portion on the display substrate is smaller than a thickness of the portion covering the third portion of the circuit board.

7. The display device of claim 5, wherein the top surface of the first sealing material is on the same plane as a top surface of the optical layer.

8. The display device of claim 5, wherein the first sealing material has a recessed portion on a bottom surface of the portion covering the third portion.

9. The display device of claim 5, further comprising a protective film layer on the top surface of the first sealing material.

10. The display device of claim 9, further comprising an adhesive layer between the top surface of the first sealing material and the protective film layer.

11. The display device of claim 9, wherein a top surface of the protective film layer and a top surface of the optical layer are on the same plane.

12. The display device of claim 5, further comprising a frame on the top surface of the first sealing material and the side surface of the portion covering the third portion.

13. The display device of claim 12, further comprising an adhesive layer between the top surface of the first sealing material and the frame.

14. The display device of claim 1, wherein the display substrate further comprises an overcoat layer on the display layer,
    wherein the optical layer is directly on the overcoat layer, and
    wherein the first sealing material directly contacts one side surfaces of the display layer, the overcoat layer, and the optical layer.

15. The display device of claim 14, wherein at least some of the first sealing material is directly on the circuit board in the pad area, and
    wherein a thickness of a portion of the first sealing material directly on the circuit board is smaller than or equal to the sum of thicknesses of the display layer, the overcoat layer, and the optical layer.

16. The display device of claim 1, wherein the first sealing material comprises a light blocking material.

17. A display device comprising:
    a display substrate having a display area and a pad area on one side of the display area in a first direction, the display substrate comprising a circuit layer and a display layer on the display area of the circuit layer;
    an optical layer on the display area of a first surface of the display substrate;
    a plurality of circuit boards on the pad area of the display substrate and spaced apart from the optical layer in the first direction; and
    a first sealing material on the pad area of the display substrate to cover the circuit boards,
    wherein the circuit boards have:
        a first portion attached to the first surface of the display substrate,
        a second portion bent downwardly from the first surface and attached to another surface of the display substrate, and
        a third portion bent between the first portion and the second portion, and
    wherein the first sealing material protrudes from one side of the display substrate in the first direction to cover at least some of an outer surface of the first portion and the third portion of the circuit boards, is not between the circuit boards and the display substrate, and exposes an outer surface of the second portion, and wherein the first sealing material contacts an area of the display substrate between the display layer and the circuit board.

18. The display device of claim 17, wherein a width of the first sealing material in a second direction crossing the first direction is the same as a width of the display substrate in the second direction.

19. The display device of claim 17, wherein the first sealing material has a top surface and one lateral side in the first direction, and wherein the top surface and the one lateral side of the first sealing material are flat.

20. The display device of claim 17, wherein the first sealing material is not on the other surface of the display substrate.

* * * * *